(12) United States Patent
Berg et al.

(10) Patent No.: US 9,661,686 B2
(45) Date of Patent: May 23, 2017

(54) METHODS, BASE STATION SYSTEM, RADIO UNIT AND RADIO HEAD OF A WIRELESS COMMUNICATION NETWORK, FOR INCREASING SIGNAL QUALITY OF SIGNALS SENT FROM THE RADIO HEAD TO THE RADIO UNIT

(71) Applicant: Telefonaktiebolaget L M Ericsson (publ), Stockholm (SE)

(72) Inventors: Miguel Berg, Upplands Väsby (SE); Per-Erik Eriksson, Stockholm (SE); Chenguang Lu, Sollentuna (SE); Peter Pääkkönen, Stockholm (SE); Elmar Trojer, Täby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 214 days.

(21) Appl. No.: 14/232,883

(22) PCT Filed: Oct. 28, 2013

(86) PCT No.: PCT/EP2013/072490
§ 371 (c)(1),
(2) Date: Aug. 8, 2014

(87) PCT Pub. No.: WO2015/043686
PCT Pub. Date: Apr. 2, 2015

(65) Prior Publication Data
US 2016/0192440 A1    Jun. 30, 2016

Related U.S. Application Data

(60) Provisional application No. 61/882,390, filed on Sep. 25, 2013.

(51) Int. Cl.
*H04W 88/08* (2009.01)
*H04B 1/04* (2006.01)
(Continued)

(52) U.S. Cl.
CPC ........ *H04W 88/085* (2013.01); *H04B 1/0475* (2013.01); *H04B 1/123* (2013.01); *H04B 1/38* (2013.01); *H04B 2001/0408* (2013.01)

(58) Field of Classification Search
CPC ........... H04Q 7/20; H04Q 9/00; H04W 84/08; H04W 88/08; H04W 4/16; H04W 4/22;
(Continued)

(56) References Cited

U.S. PATENT DOCUMENTS

2002/0123306 A1* 9/2002 Masoian ................ H04B 7/155
455/7
2007/0026837 A1 2/2007 Bagchi
(Continued)

FOREIGN PATENT DOCUMENTS

EP    1924109    5/2008
KP    20080069290    7/2008
(Continued)

OTHER PUBLICATIONS

International Preliminary Report on Patentability for Application No. PCT/EP2013/072490, mailed Aug. 28, 2015, 19 pages.
(Continued)

*Primary Examiner* — Thanh Le
(74) *Attorney, Agent, or Firm* — Nicholson De Vos Webster & Elliott, LLP

(57) ABSTRACT

Disclosed is a method performed by a base station system of a wireless communication network, for increasing signal quality of signals sent from a radio head (RH) to a radio unit (RU) over a metallic conductor. The base station system comprising a baseband unit (BBU), the RU, and the RH, and the RU is connected to the RH via the metallic conductor. The method comprises, at the RH: amplifying, by an amplification unit, a signal to be transmitted from the RH to the RU; changing the signal amplification level of the amplifi-
(Continued)

cation unit; and transmitting the amplified signal to the RU. The method further comprises, at the RU: receiving the amplified signal and compensating, by a compensating unit capable of adapting its amplification level, for the change in signal amplification level performed at the RH such that the strength of the signal is transparent to the base station system.

31 Claims, 13 Drawing Sheets

(51) Int. Cl.
*H04B 1/38* (2015.01)
*H04B 1/12* (2006.01)

(58) Field of Classification Search
CPC ....... H04M 4/04; H04M 11/00; H04B 5/0018; H04B 7/155; H04B 7/15507; H04B 7/2606; H04B 1/38; H04B 1/0475; H04B 1/123; H04B 2001/0408
See application file for complete search history.

(56) References Cited

U.S. PATENT DOCUMENTS

| | | | | |
|---|---|---|---|---|
| 2007/0173202 A1* | 7/2007 | Binder | ................ | H04B 7/2606 455/68 |
| 2008/0119198 A1* | 5/2008 | Hettstedt | ............... | H04W 16/06 455/453 |
| 2011/0050245 A1* | 3/2011 | Sato | ........................ | G01R 31/11 324/534 |
| 2014/0050482 A1* | 2/2014 | Berlin | .................... | H04B 7/155 398/115 |

FOREIGN PATENT DOCUMENTS

WO     WO-02069443     9/2002
WO     WO-2011/075024 A1     6/2011

OTHER PUBLICATIONS

Notification of Transmittal of the International Search Report and the Written Opinion of the International Searching Authority, or the Declaration for PCT Counterpart Application No. PCT/EP2013/072490, dated May 9, 2014, 10 pages.

* cited by examiner

METHODS, BASE STATION SYSTEM, RADIO UNIT AND RADIO HEAD OF A WIRELESS COMMUNICATION NETWORK, FOR INCREASING SIGNAL QUALITY OF SIGNALS SENT FROM THE RADIO HEAD TO THE RADIO UNIT

TECHNICAL FIELD

The present disclosure relates generally to a method performed by a base station system of a wireless communication network, for increasing signal quality of signals sent from a radio head to a radio unit over a metallic conductor, wherein the base station system comprises a baseband unit, the radio unit and the radio head. The present disclosure further relates to a corresponding base station system, a method performed by a radio unit, a radio unit, a method performed by a radio head and a radio head.

BACKGROUND

Wireless communication networks have evolved from pure voice networks to high-speed data networks. The 4th generation radio network long-term evolution, LTE, is able to provide capacities exceeding 100 Mbit/s in an ultra-dense small-cell installation. As most of the traffic in the wireless communication networks will be generated in-doors, ultra-dense small-cell indoor network solutions are required. Different approaches have been taken to provide network architectures able to cost-efficiently and reliably meet the run on high mobile capacity.

One such approach is to re-use existing metallic conductors in buildings, such as copper cables, e.g. Ethernet cables, and to employ a distributed base station system comprising a base band unit, BBU, and a plurality of radio heads, RH. The RHs may also be called active antenna elements, AAEs. The BBU would communicate with the plurality of RHs via the metallic conductors; one metallic conductor may be connected to one RH. Such a system may be called a Radio over Copper, RoCU, system.

A problem in such a system is that in uplink (from the RH to the BBU); the signal sent through the metallic conductor may be disturbed due to noise.

SUMMARY

It is an object of the invention to address at least some of the problems and issues outlined above. It is an object to increase quality of signals communicated uplink in a Radio over Copper, RoCU, system. It is an object to reduce the noise factor of the RoCU system in uplink.

It is possible to achieve at least some of these objects by using methods, a RoCU system, a radio head and a radio unit as defined in the attached independent claims.

According to a first aspect, a method is provided performed by a base station system of a wireless communication network, for increasing signal quality of signals sent from a radio head, RH, to a radio unit, RU over a metallic conductor. The base station system comprising a baseband unit, BBU, the RU and the RH, wherein the RU is connected to the RH via the metallic conductor. The method comprises, at the RH amplifying 102, by an amplification unit, a signal to be transmitted from the RH to the RU, changing 104 the signal amplification level of the amplification unit; and transmitting 108 the amplified signal to the RU. The method further comprises, at the RU receiving 114 the amplified signal, compensating (116), by a compensating unit capable of adapting its amplification level, for the change in signal amplification level performed at the RH such that the strength of the signal is transparent to the base station system.

According to a second aspect, a method is provided performed by a radio head, RH, operable in a base station system of a wireless communication network, for increasing signal quality of signals transmitted from the RH to a radio unit, RU, over a metallic conductor, wherein the base station system comprises a baseband unit, BBU, the RU and the RH, the RH being connected to the RU via the metallic conductor. The method comprises amplifying, by an amplification unit, a signal to be transmitted from the RH to the RU, changing the signal amplification level and transmitting the amplified signal to the RU for subsequent compensation for the signal amplification level change at the RH such that the strength of the signal is transparent to the base station system.

According to a third aspect, a method is provided performed by a radio unit, RU, operable in a base station system of a wireless communication network, for increasing signal quality of signals sent from a radio head, RH, to the RU over a metallic conductor. The base station system comprises a baseband unit, BBU, the RU and the RH, and the RU is connected to the RH via the metallic conductor. The method comprises receiving a signal transmitted from the RH, the signal being amplified by an amplification unit at the RH and compensating, by a compensating unit capable of adapting its amplification level, at the RU, for a signal amplification change performed at the RH such that the strength of the signal is transparent to the base station system.

According to a fourth aspect, a base station system of a wireless communication network is provided, the base station system comprising a baseband unit, BBU, a radio unit, RU and a radio head, RH. The RU is connected to the RH via a metallic conductor and the BBU is connected to the RU. The base station system is arranged for increasing signal quality of signals sent from the RH to the RU over the metallic conductor. The RH comprises an amplifying unit for amplifying a signal to be transmitted from the RH to the RU and for changing its amplification level, and a transmitting unit for transmitting the amplified signal to the RU. The RU comprises a receiving unit for receiving the amplified signal, and a compensating unit capable of adapting its amplification level, for compensating for the change in signal amplification level performed at the RH such that the strength of the signal is transparent to the base station system.

According to a fifth aspect, a radio head, RH, operable in a base station system of a wireless communication network, for increasing signal quality of signals transmitted from the RH to a radio unit, RU, over a metallic conductor. The base station system comprises a baseband unit, BBU, the RU and the RH, the RH being connected to the RU via the metallic conductor. The RH comprises an amplifying unit for amplifying a signal to be transmitted from the RH to the RU and for changing the amplification level and a transmitting unit for transmitting the amplified signal to the RU for subsequent compensation for the signal amplification level change at the RH such that the strength of the signal is transparent to the base station system.

According to a sixth aspect, a radio unit, RU, operable in a base station system of a wireless communication network, arranged for increasing signal quality of signals sent from a radio head, RH, to the RU over a metallic conductor. The base station system comprises a baseband unit, BBU, the RU and the RH, wherein the RU is connected to the RH via the metallic conductor. The RU comprises a receiving unit for receiving a signal transmitted from the RH, the signal being amplified at the RH and a compensating unit capable of adapting its amplification level for compensating for the signal amplification performed at the RH such that the strength of the signal is transparent to the base station system.

According to other aspects, computer programs and computer program products for being run on an RH or an RU are provided.

The above methods, RoCU system, radio head, radio unit, computer program products and computer programs may be configured and implemented according to different optional embodiments. Further possible features and benefits of this solution will become apparent from the detailed description below.

BRIEF DESCRIPTION OF DRAWINGS

The solution will now be described in more detail by means of exemplary embodiments and with reference to the accompanying drawings, in which.

DETAILED DESCRIPTION

Briefly described, a solution is provided for reducing the noise factor of a RoCU system in uplink. This is achieved by a first amplifier amplifying the signal at the RH side, before the signal is transmitted over the metallic conductor and then at the RU side, using a second amplifier for compensating for changes in the amplification level at the RH side such that the signal strength is transparent to the base station system. More particularly, the second amplifier compensates for an amplification change of +X dB at the first amplifier by changing its amplification level by -X dB. Note that X may be a positive or a negative number, wherein a negative number means attenuation. Thereby it is possible to keep a high amplification level at the RH side for low and normal input signal levels, but to lower the amplification level for high input signal levels. As a result, the noise factor of the system will be low for the desired signal level in a normal scenario, while the system is protected from the strong input signal in a blocking scenario. Low noise factor means that the noise introduced by the receiver is low. Low noise factor means high receive sensitivity, by which the receiver can decode weak signals. Noise factor is normally in linear scale, while noise factor in dB is usually referred to as noise figure. At the same time, since this system makes it possible to lower the amplification level for high input levels, it is avoided to exceed the allowed maximum signal level for the metallic conductors for high input levels.

Figure 1:
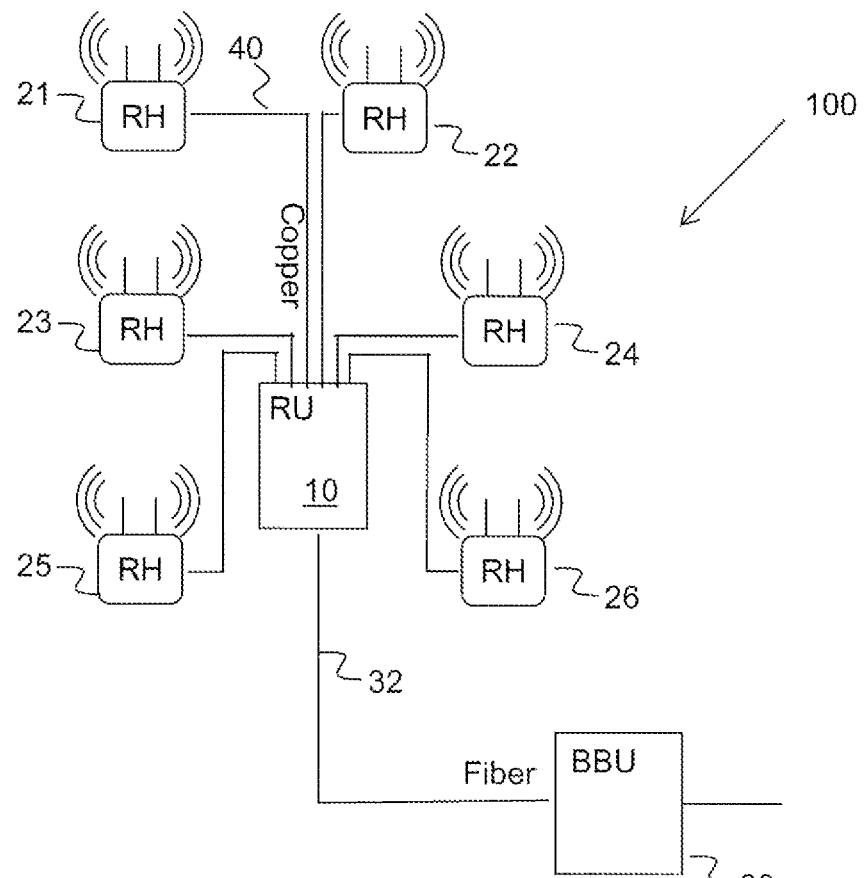
FIG. 1 is a schematic block diagram of a RoCU system according to an embodiment.

FIG. 1 shows an architecture of a base station system 100, also called a RoCU system, according to an embodiment of the invention for connecting antennas to a BBU 30 over metallic conductors 40, e.g. copper cables such as Cat 5/6/7 cables. The base station system 100 comprises the BBU 30 which is arranged to treat signals in a baseband frequency region, typically in a low frequency region. The base station system 100 further comprises a radio unit, RU, 10 connected to the BBU 30 via e.g. an optical fiber 32. Alternatively, for example: when RU and BBU are closely located, the connection between the RU and the BBU may be electrical via e.g. copper cables. The BBU 30 is arranged to generate and send a number of downlink baseband signals, also called IQ data flows, to the RU, which IQ data flows are directed to radio heads 21-26. The number of downlink baseband signals may be sent as a single digital signal from the BBU to the RU, over the optical fiber, e.g. using Common Public Radio Interface, CPRI. The radio unit, RU, 10 is arranged for generating downlink, DL, radio signals in a low intermediate frequency, IF, band from the downlink baseband signals received from the baseband unit 30. The base station system 100 further comprises a number of remote radio heads, RH, 21-26 connected to the RU 10 via the metallic conductors 40. Each RH is connected with a dedicated metallic conductor back to the RU. The radio unit 10 is further arranged to send the DL IF radio signals to the RHs via the metallic conductors. By transmitting IF signals instead of high frequency RF signals over the metallic conductors, the cable loss is reduced. An RH 21-26 is arranged for picking up the analog IF radio signals from the metallic conductor to which it is connected and for converting the IF signals to the actual radio frequency, RF, to be transmitted over the air from antenna(s) of the RH. A radio frequency region may be e.g. 400 MHz to 6 GHz. The RH comprises at least one antenna element for transmitting the DL signal to UEs.

In the uplink direction, the RHs 21-26 are each arranged to receive RF radio signals from user equipments, e.g. mobile stations, mix the RF signals to IF signals to be transported over the metallic conductors towards the RU 10 for further processing. The RU is arranged to down-convert the received IF signal to a baseband frequency for further transmission to the BBU 30. Uplink and downlink IF signals may be transported over the metallic conductors 40 via frequency duplexing for FDD radios, and/or time duplexing for TDD radios. A RoCU system is a cost-effective radio system, especially for indoor deployment.

Figure 2:
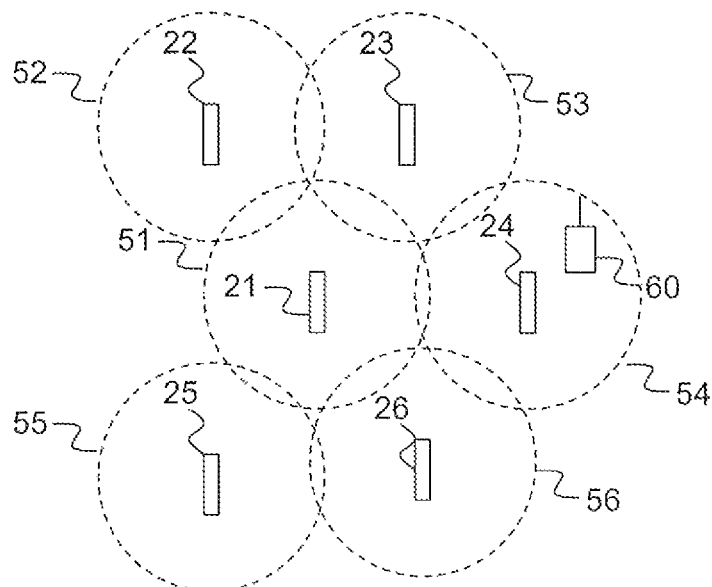
FIG. 2 is a schematic view of an exemplary cellular communication network to which coverage is provided by the RoCU system.

FIG. 2 shows a schematic view of an example of how the RHs 21-26 of FIG. 1 may be positioned to cover a geographical area. Each RH 21-26 covers a geographical area 51-56. A mobile station 60 that is situated in e.g. geographical area 54 will be connected to RH 24 and receive DL RF signals over the air from RH 24 and transmit UL RF signals over the air to RH 24. Even though FIG. 2 shows circular geographical areas, so called omnicells, any other type of geographical area may be covered, such as an angular section, a part of a building floor etc. The RHs may be arranged in a building, e.g. on different floors of the building.

Figure 3:
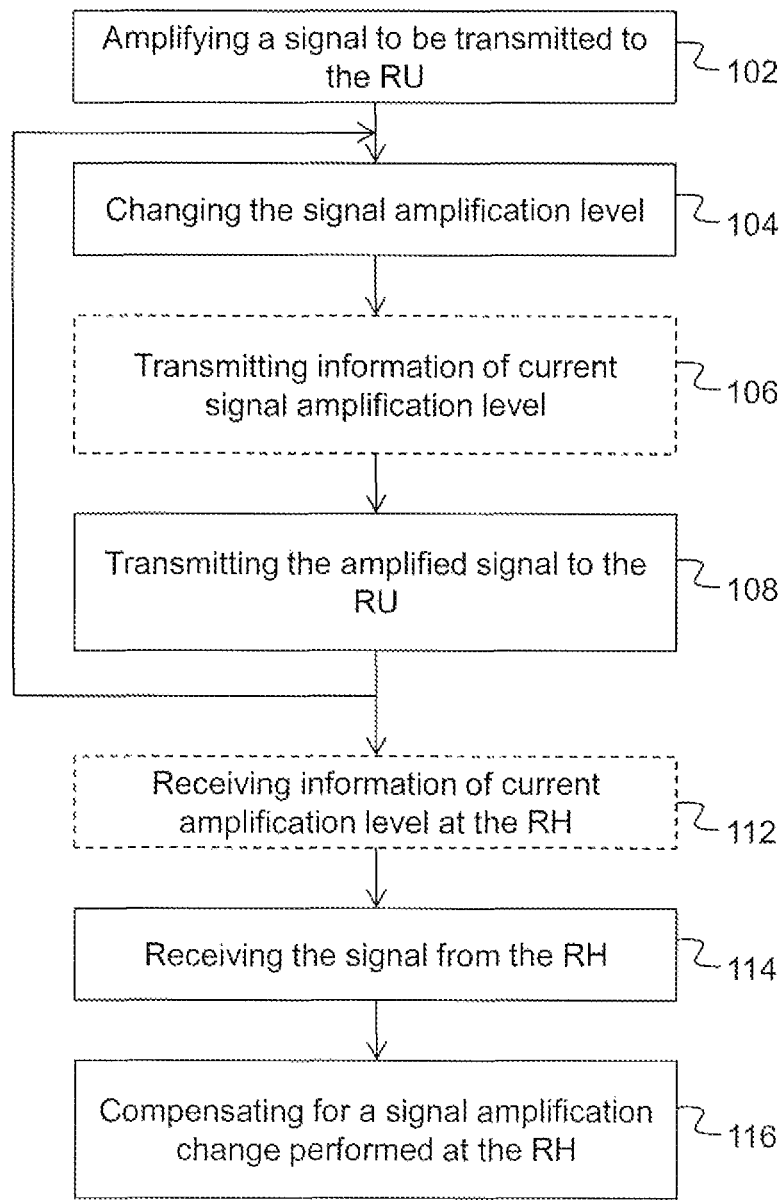
FIGS. 3-7 are flow charts of methods according to exemplary embodiments.

FIG. 3 describes a method according to an embodiment performed by a base station system 100 of a wireless communication network, for increasing signal quality of signals sent from an RH 21 to an RU 10 over a metallic conductor 40. The base station system comprises a BBU 30, the RU 10 and the RH 21. The RU 10 is connected to the RH 21 via the metallic conductor 40. The method comprises, at the RH, amplifying 102, by an amplification unit, a signal to be transmitted from the RH to the RU, changing 104 the signal amplification level of the amplification unit, and transmitting 108 the amplified signal to the RU. The method further comprises, at the RU, receiving 114 the amplified signal, and compensating 116, by a compensating unit capable of adapting its amplification level, for the change in signal amplification level performed at the RH such that the strength of the signal is transparent to the base station system.

The amplified signal is transmitted to the RU over time (preferably continuously) such that it is transmitted before and after the change of signal amplification level. To compensate for a change in signal amplification level performed at the RH such that the strength of the signal is transparent to the base station system signifies that when the signal amplification at the RH is increased with an amount, a signal amplification at the RU is decreased with approximately the same amount in the compensating step. For example, if the amplification level at the RH side is increased with 3 dB, the amplification level at the RU side is decreased with approximately 3 dB. Similarly, if the amplification level at the RH side is decreased with 5 dB, the amplification level at the RU side is increased with 5 dB. The strength of the signal may also be called signal power. That the strength of the signal is transparent to the base station system signifies that the signal power is transparent from the antenna of the RH to the input of an analogue to digital converter, ADC, of the RU (see e.g. FIG. 8).

As a further example, the amplification unit at the RH side has a normal setting level of 40 dB, further assuming cable loss 30 dB, and the compensating unit at the RU side has a normal setting level of 0 dB, resulting in a total amplification of 10 dB to the UL signal. Then the amplification level at the RH side is decreased with 5 dB, due to e.g. an increase in signal input level which would result in a signal level above what is allowed over the metallic conductor if the signal is amplified with 40 dB at the RH side. To compensate for this amplification decrease at the RH side, the amplification level at the RU side is increased with 5 dB. As a result, the total amplification from the antenna of the RH to the input of the ADC of the RU is still 10 dB, i.e. the signal strength is transparent to the base station system.

By such a method, a signal incoming to the RH may be amplified to a high signal level while the gain of the whole receiver chain remains fixed without risking exceeding the signal level being above what is allowed over the metallic conductor and/or overdriving the electronic components in the chain, e.g. mixers, amplifiers etc, and creating imbalanced gains or link budgets in UL and DL. As a result, the noise figure of the communication system (i.e. RoCU system) is significantly reduced. Thereby, longer metallic conductors can be used. Also, the radio coverage is increased since weaker signals can be received at the antenna of the RH, amplified and transmitted over the metallic conductor.

Further, noise figure of the RoCu system is reduced in uplink (UL) and therefore the UL dynamic range is increased. Further, cable reach and radio coverage is increased in the RoCu system.

According to an embodiment, the method of FIG. 3 may further comprise, at the RH, transmitting 106 information of a current signal amplification level at the RH to the RU, and, at the RU, receiving 112 information of the current amplification level at the RH. The compensation 116 is then performed according to the received information. The information of a current amplification level may be for example the actual amplification level used at the amplification unit of the RH, e.g. 40 dB, or information of amplification change since last time, e.g. a change of +5 dB. It may also be information of amplification decrease or increase, for example in a stepwise manner, e.g. amplification has increased with an increment, or decreased with an increment. A large amplification change at the RH side would then result in a number of information signals being sent to the RU, e.g. if the increment is set to 1 dB, a change of 5 dB at the RH side would result in 5 information signals being sent, each informing of an increase in amplification level at the RH side. Thereby, the RU is informed how to adjust the amplification of its compensating unit such that strength of the signal is transparent to the base station system.

Figure 4:
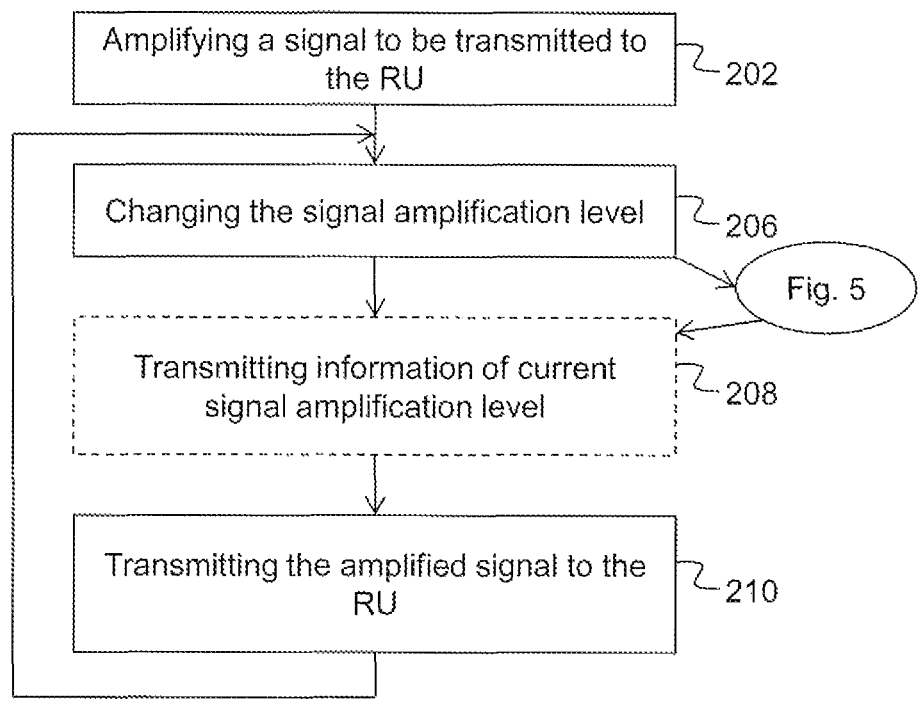

FIG. 4 (and FIG. 1) describes a method according to an embodiment performed by a radio head, RH 21, operable in a base station system 100 of a wireless communication network, for increasing signal quality of signals transmitted from the RH to a radio unit, RU 10, over a metallic conductor 40. The base station system comprises a baseband unit, BBU 30, the RU and the RH, the RH being connected to the RU via the metallic conductor. The method comprises amplifying 202, by an amplification unit, a signal to be transmitted from the RH to the RU. The method further comprises changing 206 the signal amplification level; and transmitting 210 the amplified signal to the RU for subsequent compensation for the signal amplification level change at the RH such that the strength of the signal is transparent to the base station system.

According to an embodiment, the signal to be transmitted is amplified 202 to a signal strength level approximately equal to a maximum allowed signal strength level of the metallic conductor, or is amplified 202 by a maximum possible gain of the amplifier, when the signal strength level to which the signal is amplified with maximum possible gain is below the maximum allowed signal strength level of the metallic conductor. Thereby, a high signal to noise ratio is achieved over the metallic conductor, which results in a low noise figure.

According to another embodiment, the method may further comprise transmitting 208 information of a current signal amplification level to the RU. The signal amplification level means how much the signal is amplified at the RH. The signal may be amplified by an amplification unit, and the amplification may be determined as output level at an output of the amplification unit divided by an input level at an input of the amplification unit. The amplification unit may be an AGC. By transmitting information of the current signal amplification level to the RU it is possible for the RU to determine how much the signal amplification level has changed at the RH and thereby how to adapt the gain amplification of its compensating unit.

According to another embodiment, the information of the signal amplification level is transmitted 208 over a carrier frequency outside a frequency band used for the transmission of the amplified signal. Thereby, a more robust communication channel can be selected for the information of the current amplification level than used for the actual signal, which ensures that the information is correctly received at the RU-side.

Figure 5:
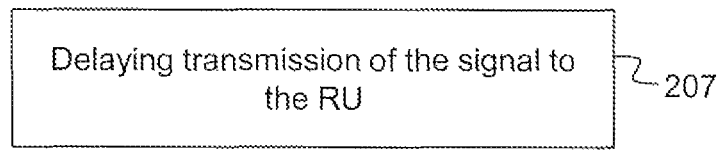

According to another embodiment, shown in FIG. 5, the method further comprises delaying 207 the transmission of the amplified signal to the RU in relation to the transmission 208 of the information of the current amplification level such that the signal is received at the RU at substantially the same time as a compensation is started to be performed at the RH according to the transmitted information of the current amplification level. The transmission of the information of amplification level may have some processing delay in relation to the transmission of the actual signal, which results in that the information of a gain change is received later than the actual signal at the RU. As a result, the compensation is performed a bit too late. This delay may cause glitches in the signals. This embodiment makes it possible to considerably shorten such glitches. The processing delay may occur due to modulation and/or encoding of the information at the RH before it is transmitted, and a corresponding demodulation and decoding at the RU-side, when received. In an alternative embodiment, the delay of the signal may instead be performed at the RU side, before the signal is fed to the compensating unit.

Figure 6:
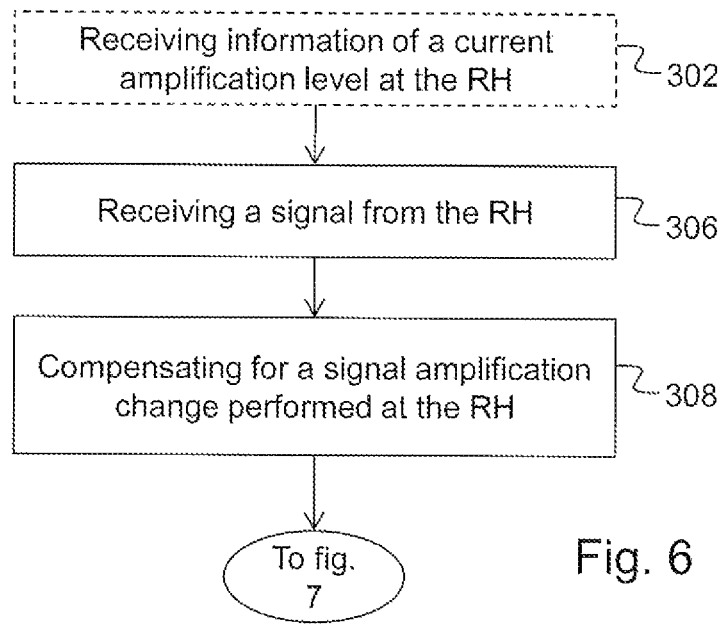

FIG. 6 (and FIG. 1) describes a method according to an embodiment performed by a radio unit, RU, 10 operable in a base station system 100 of a wireless communication network, for increasing signal quality of signals sent from a radio head, RH 21, to the RU 10 over a metallic conductor 40. The base station system 100 comprises a baseband unit, BBU 30, the RU and the RH. The RU is connected to the RH via the metallic conductor. The method comprises receiving 306 a signal transmitted from the RH, the signal being amplified by an amplification unit at the RH, and compensating 308, by a compensating unit capable of adapting its gain amplification, at the RU, for a signal amplification change performed at the RH such that the strength of the signal is transparent to the base station system.

According to an embodiment, the method of FIG. 6 may also comprise receiving 302 information of a current amplification level at the RH from the RH, and controlling the compensation of the compensating unit according to the received information.

If the information of the current amplification level at the RH shows that the amplification level has decreased with a certain amount since last received information, the compensating in the RU is performed such that the amplification level of the compensating unit is increased with the same amount. According to an embodiment, this may be accomplished by using a look-up table. The gain settings of the amplification unit and the compensating unit are then 1-to-1 mapped such that the compensating unit compensates the amplification unit gain changes accordingly. The compensating unit just needs to use the corresponding gain value in the table once the compensating unit gain setting is known. In this way, the RU knows how to adjust the amplification of its compensating unit such that strength of the signal is transparent.

According to another embodiment, the receiving 302 of information may comprise, at a first point of time, receiving information from the RH of a current amplification level at the RH and at a second point of time later than the first point of time, receiving information from the RH of a current amplification level at the RH, and comparing the amplification level at the second point of time with the amplification level at the first point of time to detect a difference in amplification level. Then the compensating 308 may be controlled according to the detected difference in amplification level.

According to another embodiment, the information of the current amplification level may be received 302 over a carrier frequency outside a frequency band used for the reception of the signal. "A carrier frequency" signifies one or more carrier frequencies. The information may be transmitted over one frequency or over more than one carrier frequency.

Figure 7:
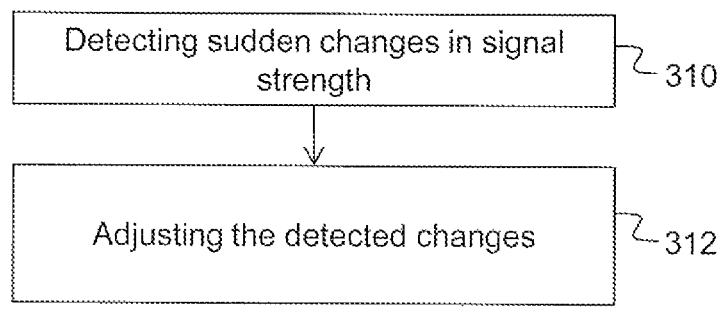

According to another embodiment, shown in FIG. 7, the method may further comprise, after the compensation 308 has been performed, detecting 310 sudden changes in signal strength, and adjusting 312 the detected changes such that the signal strength is reduced at the detected changes. Thereby, glitches in the signal strength are compensated for, e.g. smoothed out.

According to another embodiment, the information of the current amplification level may be modulated and possibly also encoded by the RH before the information is transmitted to the RU. Further, the received information of the current amplification level may then be demodulated and possibly also decoded by the RU.

According to another embodiment, the compensating for a signal amplification adjustment performed at the RH is only performed if under normal operating conditions, and, if under a special operating condition differing from the normal operating conditions, the compensating for the signal amplification adjustment performed at the RH is only partially performed, i.e. the change of amplification level is only partially compensated. The term "under normal operating conditions" may mean when the signal strength of the received signal is below a signal strength threshold, the signal strength threshold representing a signal of a blocking user, which signal results in a noise figure increase above a certain level. A special operating condition may mean when the signal strength of the received signal is above the same signal strength threshold. This embodiment is especially advantageous in a distributed antenna system, DAS, configuration. For more information of a DAS, see FIG. 14. In a DAS, employing such an embodiment in one branch (i.e. subsystem comprising an RH connected to an RU), reduces noise figure for other branches in the DAS, and therefore benefits other users connected to other branches, even though the partially compensated branch is penalized a bit. But the partially compensated branch anyway has a degraded performance due to deep blocking (strong blocking signal).

According to an embodiment, the RH comprises an AGC (automatic gain control) and the RU comprises a gain compensator (e.g. a VGA, variable gain amplifier or a variable attenuator), both arranged in the UL direction. The gain compensator may be arranged to simultaneously compensate for the gain adjustment performed by the AGC. For example, if the AGC increases the gain by 3 dB, the gain compensator reduces its gain by 3 dB such that the signal strength is transparent to the BBU. According to an embodiment, the AGC amplifies the UL received signal to a maximum transmit signal strength allowed at the copper interface or amplifies the UL received signal with the maximum gain such that the transmit signal strength is less than the maximum allowed signal strength at the metallic conductor interface, e.g. copper cable. According to another embodiment, information of the gain setting of the AGC is modulated with a proper modulation scheme (e.g. FM, AM, PM, FSK, MSK, ASK, PSK etc.) and transported on a dedicated frequency carrier to the RU over the copper cable.

The gain compensator in the RU receives the demodulated information of the gain setting and compensates the gain accordingly.

Furthermore, according to another embodiment, to suppress glitches occurring due to the gain change delay between the AGC and the VGA, a second local AGC is added in the RU for glitch suppression. The second local AGC also protects the ADC from saturation.

RoCu Link Noise Factor

Noise factor is a key parameter in analog system design. It basically measures how noisy the system is. The noise factor represents the factor by which the output noise level is increased from the input noise level, $N_0$, attributable to thermal noise in the input termination at standard temperature T0 (usually 290 K). Noise factor in dB is normally referred to as noise figure. If there are no other interferences at the input, the noise figure represents the SNR degradation of the system. For a receiver design, noise factor represents the receive sensitivity degradation.

Figure 8:
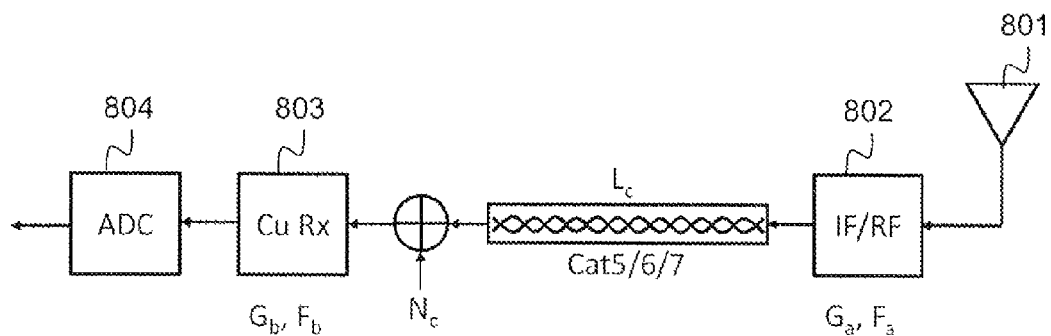
FIG. 8 is a schematic block diagram of an embodiment of a base station system.

FIG. 8 shows a system model for calculating the noise factor of a RoCu UL link. The received UL RF signal, sent from a UE and received by an antenna 801 is first mixed down by an RF/IF unit 802 of the RH to an IF frequency, preferably a low IF frequency. Then the mixed-down IF signal is transmitted over the copper cable, illustrated as Cat5/6/7 in FIG. 8. The RF/IF unit 802 is modeled with the gain of Ga and the noise factor of Fa. The IF signal goes through the copper cable with cable loss modeled as Lc. The cable background noise is modeled as an additive noise source with noise level Nc, which is used to model the Electromagnetic Interference, EMI, noise coupled into the cable from the outside. Then the IF signal is received by a copper receiver unit, Cu RX 803, e.g. of the RU, with the gain of Gb and the noise factor of Fb. Thereafter, the IF signal is converted from analog to digital form in an analog to digital, ADC, unit 804.

As modeled in FIG. 8, the noise factor of the system can be calculated as $$F = F_a + \frac{N_c/N_0}{G_a}L_c + \frac{F_b - 1}{G_a}L_c$$

From the equation above, the higher the gain $G_a$ is, the lower the noise factor is. In practice, the first term $F_a$ is relatively small. Approximately, the noise factor is proportional to the ratio $L_c/G_a$. In an example discussed in this disclosure, we assume $F_a$=3 dB, $F_b$=10 dB, $N_c$=−160 dBm/Hz and $N_0$=−174 dBm/Hz.

Automatic Gain Control (AGC)

In mobile networks, the range of the received UL signal power is quite large due to the varying distance from UEs to the antenna of the base station. For coordinated UEs under power control, the maximum received signal power can be as high as −40 dBm for near UEs, while the minimum received signal power can be below −90 dBm for the far UEs. However, there are possibilities that there are uncoordinated UEs within the system bandwidth, which are very close to the antenna and transmit high power. An uncoordinated UE may be a UE that communicates in a network different from the present network, that at least partly overlaps with the present network, but wherein the uncoordinated UE happens to be close to a base station antenna of the present network. In a severe use case, when the uncoordinated UE is 1 meter away from the base station antenna (e.g. 35 dB path loss) and transmits maximum power (e.g. 23 dBm), (since the base station it communicates with is far away) the maximum received signal power can be −12 dBm.

Furthermore, due to regulations regarding conducted and/or radiated emissions, the transmit power over copper cables may be limited to a certain highest allowed value denoted as Pc. For example, for Cat5/6/7 cables, for a signal with 20 MHz bandwidth transmitted above 30 MHz, the transmit power may be limited to a maximum of −3 dBm.

The simplest way for the gain setting is to use a fixed gain. In order not to violate the power limit regulation, the maximum fixed gain Ga should be set as $$G_a = P_c - P_{r,max},$$

where Pc is the regulated transmit power limit of the copper cable and Pr,max is the maximum received signal power at an antenna of the RH. When Pr,max is high, Ga will be low and thereby the noise factor is high. The higher blocking protection that is required, the higher is the noise factor, when using a fixed gain setting. This would penalize the receive sensitivity and the bit rate per coverage.

Using AGC can improve the noise factor, especially when the signal is weak. Ideally, the AGC should dynamically adjust the gain according to the current received signal power gain as $$G_a(t) = P_c - P_r(t),$$

where Pr(t) is the received signal power at time t. Basically, the gain is adjusted high when the received signal power is low. So the noise factor can be significantly improved when the signal is weak.

Figure 9:
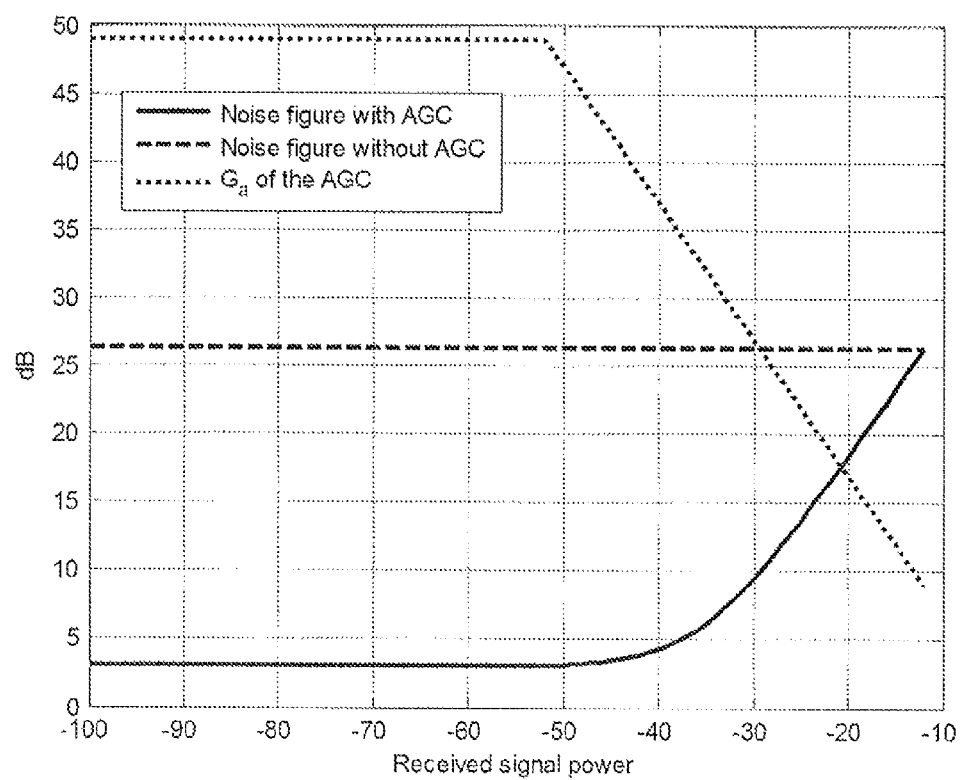
FIGS. 9-10 are flow charts showing noise figures of different embodiments.

FIG. 9 shows the improvements from using an AGC with 40 dB dynamic range for a cable with 20 dB cable loss. For the desired signal power range from −52 to −100 dBm, the noise figure with AGC is 3.1 dB, while the noise figure without AGC is 26.3 dB. The noise figure is 23 dB improved. It means the receive sensitivity is increased by 23 dB. The maximum coverage is increased by 5.8 times in radius, assuming path loss exponent=3.1 in air interface. It is worth noting that the gain in this example adjusts only for the high received power between −52 dBm and −12 dBm. For the desired signal power range, i.e. from −100 dBm to −52 dBm, the AGC setting is constant (49 dB in FIG. 9). Therefore, using AGC enables using high gain for the most relevant range of the users in the coverage and at the same time using the lower gain to prevent high power users to violate the PSD regulation. The AGC can also be used to protect the copper line driver, mixer etc. from saturation.

Figure 10:
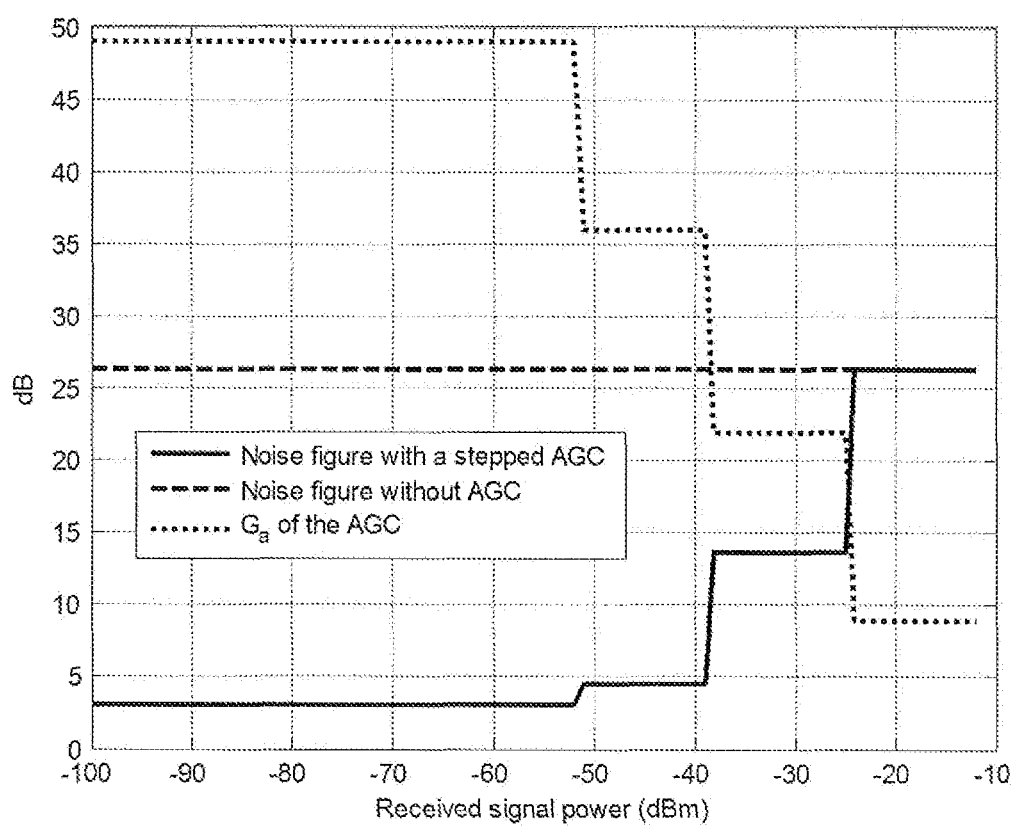

In an analog design, the gain adjustment of the AGC may be continuous. The performance has been illustrated by the smooth curve in FIG. 9. In a digital design, the gain adjustment is stepped with several gain values, which can be configured. The steps are indexed (coded in bits), each of which corresponds to a pair of the gain setting for the AGC and the VGA compensating the AGC gain adjustment. FIG. 10 shows an example of the noise figure improvement using a 4-level stepped AGC. In this example, only 2 bits are needed to index the steps. This would ease the capacity requirement for the communication channel for the gain information and may also simplify the design. In practice, the levels may be configurable.

Embodiment of an AGC Design

In the traditional AGC design, the digital, baseband, processing unit (e.g. for PHY layer processing) positioned after an analog to digital converter, ADC, in the uplink direction, needs to track the gain adjustment done by the AGC almost simultaneously. It is done by a feedback loop, where the digital processing unit measures the signal strength and controls the gain of AGC. Or it is done by a feed-forward loop where the gain adjustment of the AGC is fed to the digital processing unit and the digital processing unit compensates the gain adjustment by AGC before further processing. Without the baseband AGC tracking, it would cause imbalance link budget due to path loss imbalance between DL and UL. This would cause significant performance issues for some key baseband algorithms (e.g. power control, cell selection, handover etc.), which expect that the DL and UL path losses or link budget are balanced.

However, the above designs suit only the situation when the AGC is collocated with the digital processing unit. In the RoCu system, the BBU is located after the ADC in the RU, in the uplink direction, while the AGC is located in the RH. The management channel between RU and RH, used for configuration, alarms etc is not fast enough to track the gain adjustment of the AGC since it is designed not to waste valuable IF signal bandwidth. Low bitrate in combination with, delay caused by the Layer 2, L2, processing (e.g. mux/demux with other messages, en/de-capsulation operations) makes this channel unsuitable for AGC control.

Figure 11:
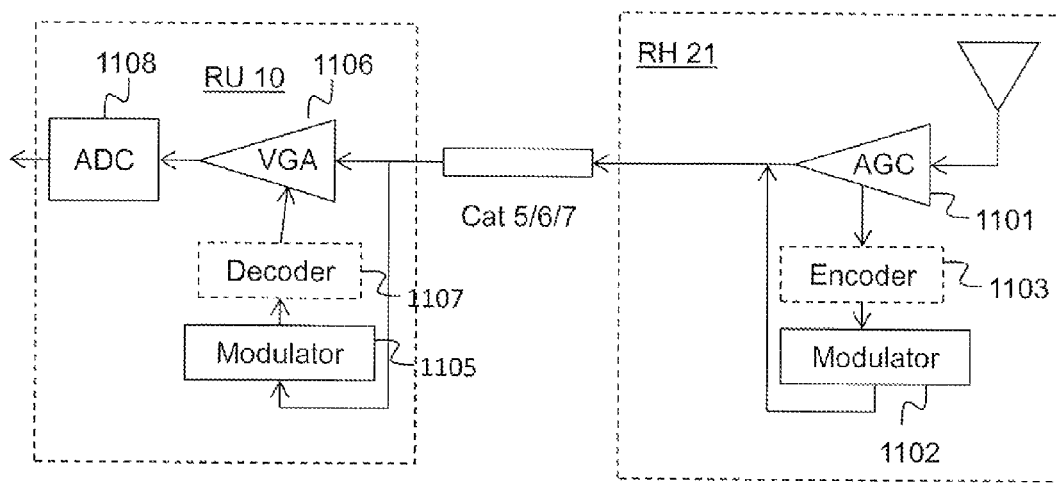
FIGS. 11-14 are schematic block diagrams of embodiments of base station systems.

An embodiment of this invention is shown in FIG. 11. On the RH 21 side, the AGC 1101 adjusts the gain setting according to the signal power measured at an input of the AGC such that the output power to the copper cable becomes the maximum power allowed or almost the maximum power allowed over the copper cable. Note that the AGC loop structure, as in a standard AGC circuit (i.e. the loop of power measurement and gain adjustment) is not shown here. The gain setting may also be called the amplification level. The gain setting information, a.k.a. the information of the amplification level, e.g. in the format of the analog signal for analog AGC or in the format of digital signal or bits for digital AGC, may be modulated in a modulator 1102 with a proper modulation scheme (e.g. frequency Modulated, FM, Phase Modulated, PM, and Amplitude Modulated, AM, for analog signal and Frequency Shift Keying, FSK, Phase Shift Keying, PSK, and Amplitude Shift Keying, ASK, for digital signal). Further, the modulated signal may be transmitted on a carrier frequency out of band of the RoCu signal band and a management channel band. On the RU 10 side, the modulated signal for the AGC gain setting information is first extracted from the line by proper filtering and demodulated by a demodulator 1105. Then, the demodulated signal (i.e. the gain information) is used to control the gain of a variable gain amplifier, VGA 1106, such that the VGA gain compensates for a gain adjustment done by the AGC 1101. For example, if the AGC reduces its gain by 5 dB because its input signal gets 5 dB stronger, the VGA should increase its gain by 5 dB to compensate the AGC gain change. In this way, from the perspective of the digital processing unit, the signal power is transparent from the antenna to the input of an ADC 1108 of the RU 10. Another advantage is that the invention does not require any change in the baseband processing software.

In FIG. 11, there are two optional coding blocks: an encoder block 1103 after the AGC and a decoder block 1107 before the VGA. For digital/stepped AGC, coding the gain data can add redundancy and therefore increase the robustness of the data. Note that in FIG. 11, the components related to down-conversion (i.e. mixers) are not shown here to simplify the denotation. For example, in the RH in UL, the received RF signal is down-converted to IF signal, and in the RU in UL, the IF signal is down-converted to a baseband signal.

Delay Compensation for the Communication Channel Extra Delay

Figure 12:
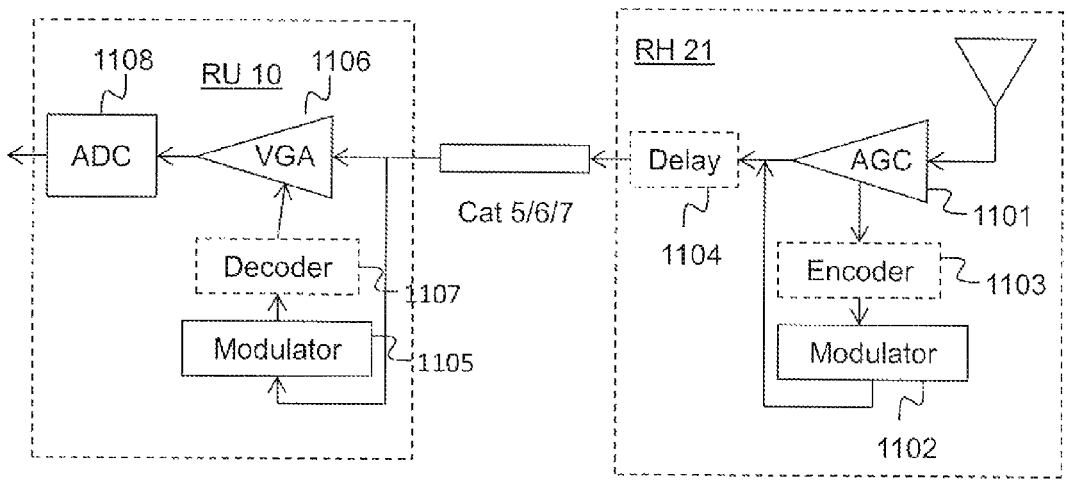

The communication channel for communication of the AGC gain setting information may experience delay due to e.g. processing delays for encoding/decoding, modulation/demodulation, etc. The same amount of delay is not experienced for the actual (data) signal communicated over the copper cable. As a result, there is a delay between the AGC gain change and the gain compensation in the VGA. This delay would cause glitches in the signal (sudden changes in signal amplitude). The glitches modulate the signal in amplitude and cause distortions to the desired signal. This can significantly degrade the performance, i.e. the quality of the transmitted signal. To minimize the delay for the transmission of the AGC setting information in relation to the transmission of the signal, a delay circuit is inserted to delay the signal such that the signal adjusted by the AGC arrives at the VGA at the same time as the VGA changes its gain to compensate the AGC. As one example, shown in FIG. 12, a delay circuit 1104 is inserted after the AGC block 1101 in the embodiment of FIG. 11. It can also be placed in other places in FIG. 11 to balance the delay. For example, the delay circuit can be placed also in front of the VGA in the RU. If the transmission delay of the communication channel for processing and transmitting the AGC gain setting information in relation to the signal transmission delay is known, the delay circuit is configured to delay the signal by the known delay difference. This may be necessary if the communication channel delay is not sufficiently low.

2nd AGC in RU for Glitch Suppression

Figure 13:
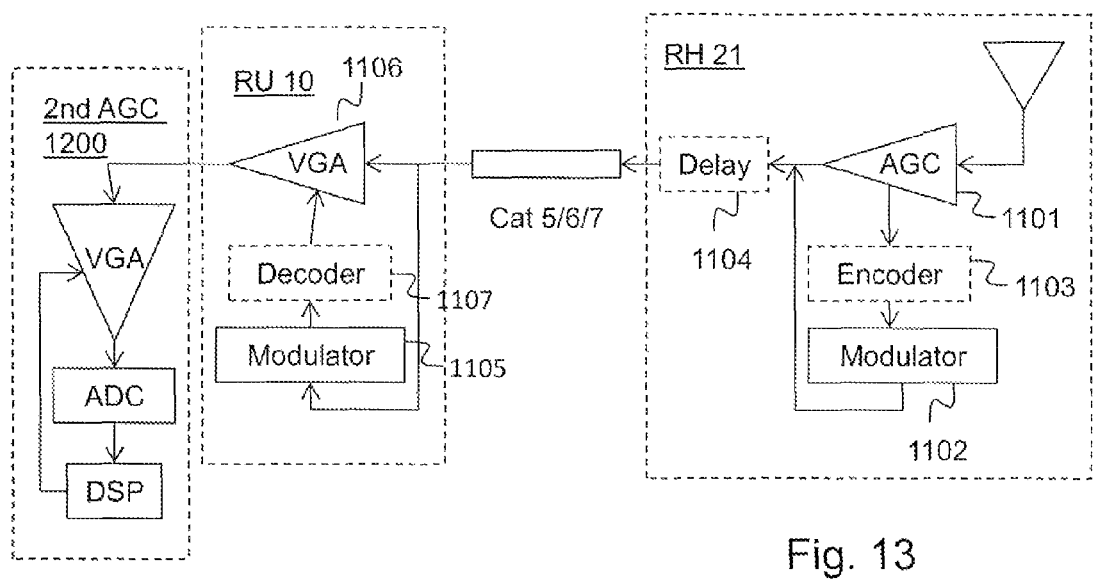

With the delay circuit 1104, the distortions due to glitches are lowered but it is difficult to completely remove the glitches. For example, it is difficult to exactly estimate the extra delay of the gain setting communication channel delay. In FIG. 13, a 2nd AGC 1200, comprising a VGA, an ADC and a digital signal processor, DSP, is added after the VGA 1106 in the RU 10 to suppress the remaining glitches. Basically, the DSP detects samples affected by the glitches and then mitigates the glitch effect by zeroing-out the samples or reducing the amplitude of the samples. It has been proven an effective method to mitigate short glitches, especially in presence of strong blocking signals. More details can be found in patent application document WO 2011/075024. A further advantage with the 2nd AGC is that it protects the signal from saturating the ADC.

Distributed Antenna System, DAS, Configuration

Figure 14:
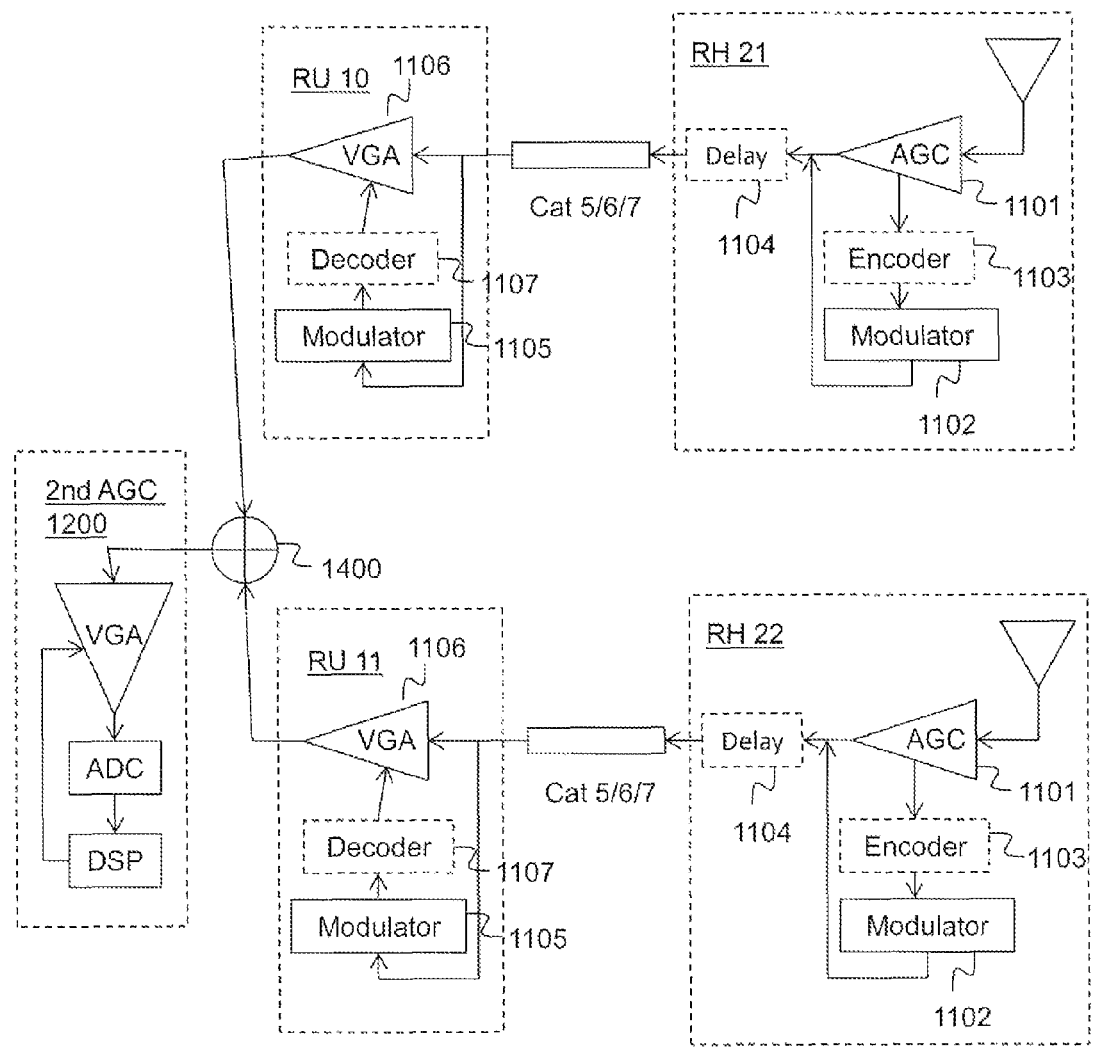

A DAS configuration equipped with the invented AGC system is illustrated in FIG. 14. The signals received from a first branch (upper branch in figure) and from the second branch (lower branch in figure) are combined together before reaching the second AGC 1200. The FIG. 14 only shows two branches but is equally applicable for a multiple of branches, or all branches. By having only one ADC for a plurality of branches, e.g. all branches, reduces the hardware costs.

In a DAS configuration, the signals from different RH branches are combined together in a signal combiner before going through the ADC of the second AGC 1200. In this case, the noise figure for any branch k is $$F_{DAS,k} = F_k + \left(\frac{1}{G_k}\right)\sum_{i \neq k} G_i F_i$$

where Fi is the noise factor per branch and Gi is the overall gain from antenna to the signal combiner including the gains of IF/RF and Cu Rx (Ga and Gb), and the cable loss (Lc). It shows that the noise figure is increased by the second term due to the signal combining.

When severe blocking happens in one branch, its noise figure could increase dramatically. Due to the signal combining, the noise figure increase in the blocking branch increases the noise figure in other branches as well. Reducing the gain of the blocking branch can reduce the noise figure of other (non-blocked) branches at the cost of further reduced performance in the blocked branch. A blocking signal above a certain level thus represents a special operating condition where it may be beneficial for the system to deviate from the transparent gain approach used in normal operating conditions. This can be represented in different ways, e.g. by a threshold on input power or on the amount of gain compensation.

When a branch is blocked above the special operating condition threshold, the gain adjustment of the VGA in the first AGC can switch to partial instead of full compensation of the gain change of the AGC. This will reduce the overall noise figure due to the reduced total gain for the blocked branch. The UEs connected to other branches (RH ports) would benefit from the reduced noise figure. Examples of partial compensation include fractional dB compensation (e.g. 0.5 dB compensation for every dB AGC change above the special operating condition threshold), zero compensation above the special operating condition threshold, or even negative compensation (suppressing the signal further, including the possibility to completely disable the branch).

Figure 15:
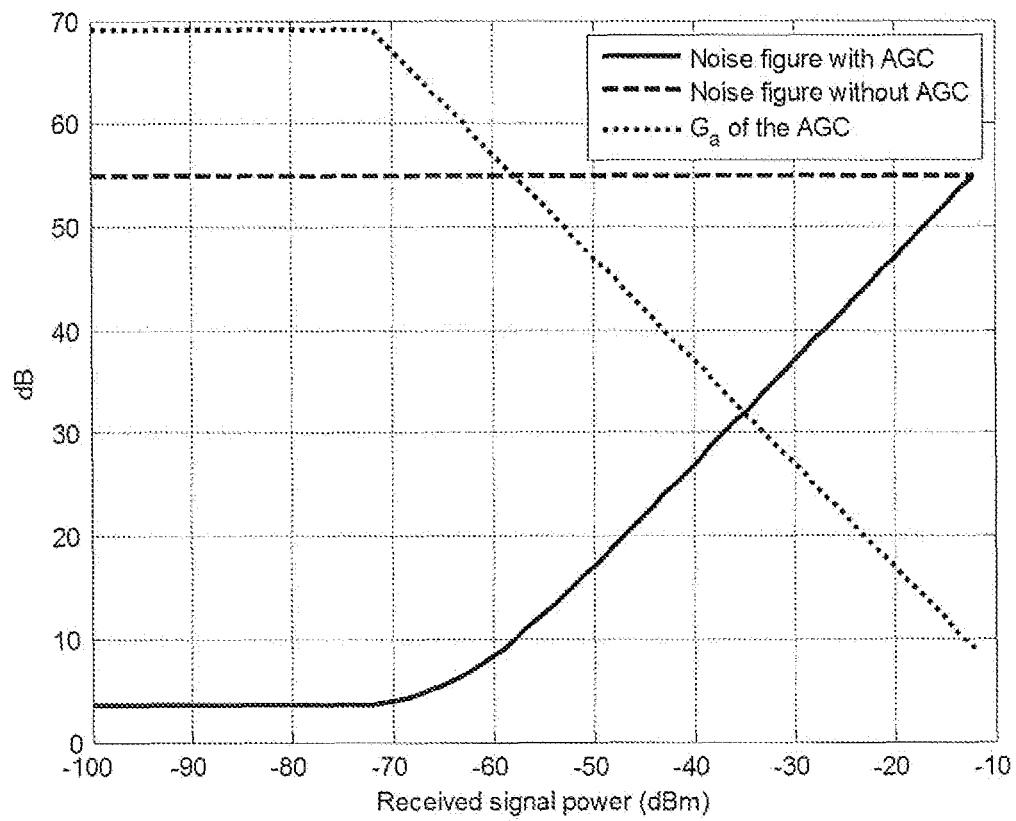
FIG. 15 is a flow chart showing noise figures of an embodiment.

When cable noise is high e.g. due to crosstalk, more levels of gain are needed. It also needs a bigger dynamic range to have a higher gain to reduce the noise figure for weak signals. FIG. 15 shows such needs with an example of high cable noise of −130 dBm/Hz.

Regarding the gain information communication channel, the gain information can be modulated in different forms, e.g. in amplitude, phase, frequency etc. Different gain levels can also be coded by the on-off states of several frequency carriers.

The gain information may also be information of the gain adjustment of the AGC in the RH, i.e. the change of gain or amplification. This can simplify the communication channel design. For example, the gain information can be coded with 2 bits, in which 00 means invalid, 01 means gain increased, 10 means gain decreased and 11 means unchanged. As an example, this can be easily coded with two tones. 00 is tone 1 off and tone 2 off, 01 is tone 1 off and tone 2 on, 10 is tone 1 on and tone 2 off, and 11 is tone 1 on and tone 2 on. The RH has a gain table and the RU has a gain compensation table, which are 1-to-1 matched. The RH adjusts the gain one step up or down only at a time according to the gain table. The RU detects the on-off states of two tones and adjusts accordingly the gain compensation one step up or down according to the gain compensation table. In this way, the gain change in the RH and the gain compensation in the RU are synchronized. Basically, for the RU to compensate on a large change in amplification/gain at the RH side, it may take multiple steps.

Figure 16:
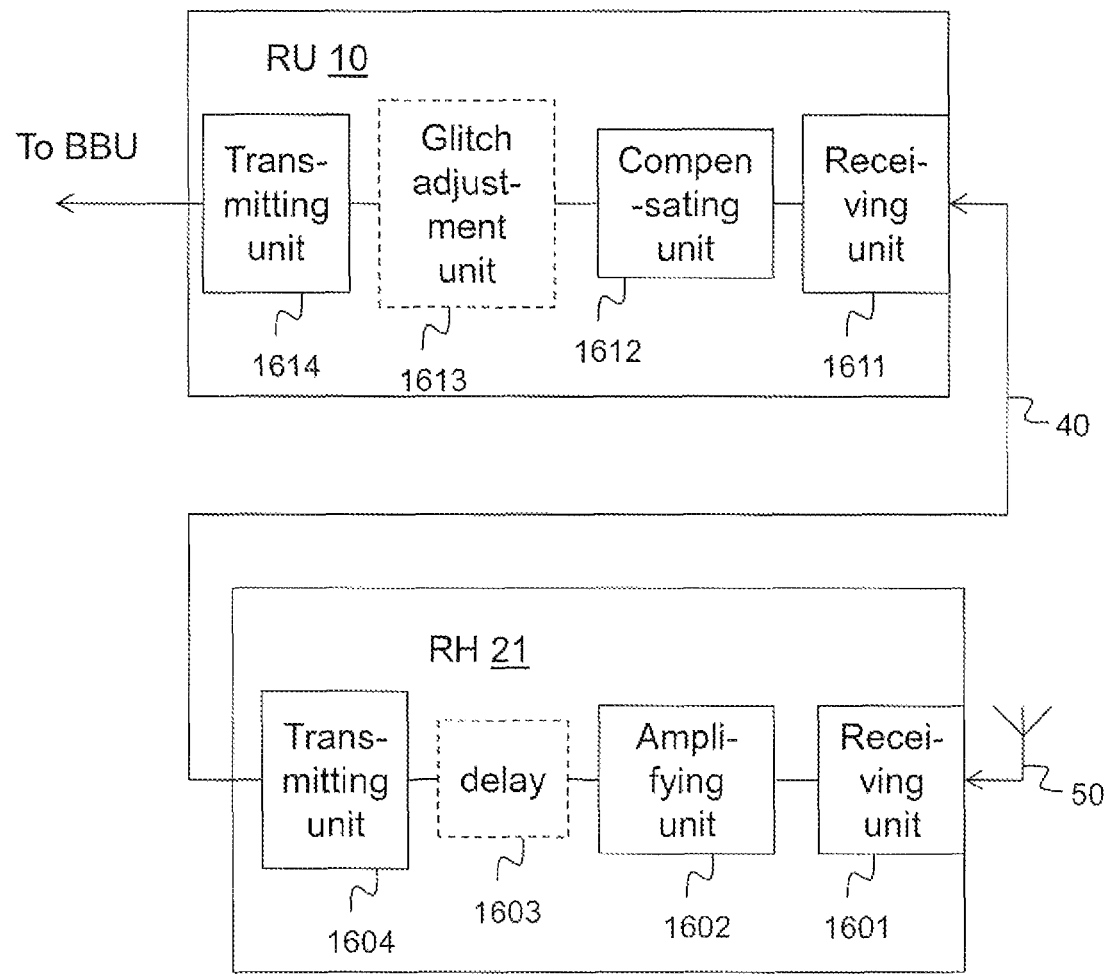
FIG. 16 is a schematic block diagram of an exemplary embodiment of a base station system comprising an RU and an RH.

FIG. 16 shows a part of a base station system of a wireless communication network, the base station system comprising a baseband unit, BBU, a radio unit, RU 10 and a radio head, RH, 21. The RU 10 is connected to the RH 21 via a metallic conductor 40. The BBU is connected to the RU 10. The base station system is arranged for increasing signal quality of signals sent from the RH to the RU over the metallic conductor. The RH 21 comprises an amplifying unit 1602 for amplifying a signal to be transmitted from the RH to the RU and for changing its amplification level, and a transmitting unit 1604 for transmitting the amplified signal to the RU. The RU 10 comprises a receiving unit 1611 for receiving the amplified signal, and a compensating unit 1612 capable of adapting its amplification level, for compensating for the change in signal amplification level performed at the RH such that the strength of the signal is transparent to the base station system.

According to an embodiment, the transmitting unit 1604 of the RH may be arranged for transmitting information of a current signal amplification level at the RH to the RU. The receiving unit 1611 of the RU may be arranged for receiving information of the current amplification level at the RH and the compensating unit 1612 of the RU may be arranged for compensating for the change in signal amplification level performed at the RH according to the received information.

Further, the base station system in FIG. 16 may comprise a plurality of RHs 21-22, arranged as the RH of FIG. 16 and a plurality of the RUs 10-11 arranged as the RUs of FIG. 16. In addition, the base station system may comprise a combiner (1400 in FIG. 14) for combining an output signal from each of the compensating units 1612 of the plurality of RUs, and an automatic gain control, AGC, unit (1200 in FIG. 14) connected to the combiner for receiving the combined output signals.

Figure 17:
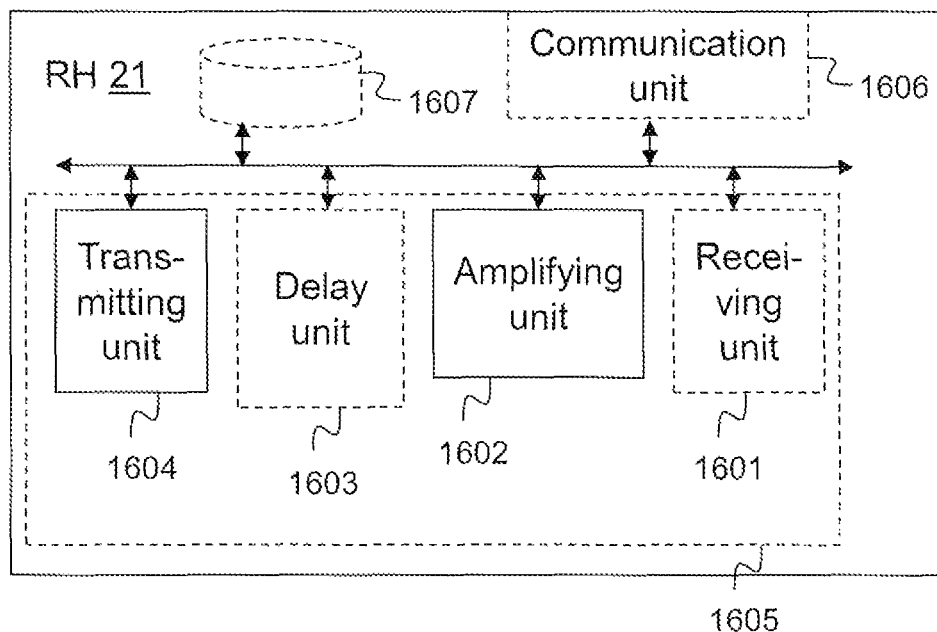
FIG. 17 is a schematic block diagram of an exemplary embodiment of an RH.

In FIG. 17 an RH 21 according to an embodiment is shown, which is operable in a base station system of a wireless communication network, for increasing signal quality of signals transmitted from the RH to an RU, over a metallic conductor. The base station system comprises a BBU, the RU and the RH. The RH is connected to the RU via the metallic conductor. The RH 21 comprises an amplifying unit 1602 for amplifying a signal to be transmitted from the RH to the RU and for changing the amplification level, and a transmitting unit 1604 for transmitting the amplified signal to the RU for subsequent compensation for the signal amplification level change at the RH such that the strength of the signal is transparent to the base station system. The amplifying unit may be an automatic gain control, AGC, unit or any other similar unit that may adapt the amplification level such that the unit outputs a requested signal output level, and possibly also outputs information of the amplification level. The RH 21 110 may further comprise a communication unit 1606, which may be considered to comprise conventional means for communication from and/or to the RU and from and/or to mobile stations. The network node 110 may further comprise one or more storage units or memories 1607.

According to an embodiment, the amplifying unit 1602 is arranged to amplify the signal to be transmitted to a signal strength level approximately equal to a maximum allowed signal strength level of the metallic conductor, or to amplify the signal to be transmitted with a maximum possible gain of the amplifier, when the signal strength level to which the signal is amplified with maximum possible gain is below the maximum allowed signal strength level of the metallic conductor. I.e. when the signal level inputted to the amplifying unit is of such amplitude that when it is amplified with maximum gain of the amplifying unit, the output signal strength level is below the maximum allowed signal strength level of the metallic conductor, the signal is to be amplified with maximum gain. If this is not the case, i.e. when the output signal strength level would be above the maximally allowed if amplified with maximum gain, the signal is amplified with a gain that makes the output signal be similar to the maximum allowed signal strength level or advantageously a slight bit below the maximum allowed signal strength level.

According to another embodiment, the transmitting unit 1604 may further be arranged for transmitting information of a current signal amplification level to the RU.

According to another embodiment, the transmitting unit 1604 may further be arranged for transmitting the information of the signal amplification level over a carrier frequency outside a frequency band used for the transmission of the amplified signal.

According to another embodiment, the RH may further comprise a delay circuit 1603 for delaying the transmission of the signal in relation to the transmission of the information of the current amplification level such that the signal is received at the RU at substantially the same time as a compensation is started to be performed at the RH according to the transmitted information of the current amplification level. The delay circuit may alternatively be placed in the RU, before the signal reaches the compensating unit. The RH may further comprise a receiving unit 1601 for receiving the incoming signal from mobile stations communicating with the RH via the antenna 50 of the RH.

The receiving unit 1601, the amplifying unit 1602, the delay unit 1603 and the transmitting unit 1604 may be arranged in an arrangement 1605. The arrangement 1605 could be implemented e.g. by one or more of: a processor or a micro processor and adequate software and storage therefore, a Programmable Logic Device, PLD, or other electronic component(s)/processing circuit(s) configured to perform the actions, or methods, mentioned above.

Figure 18:
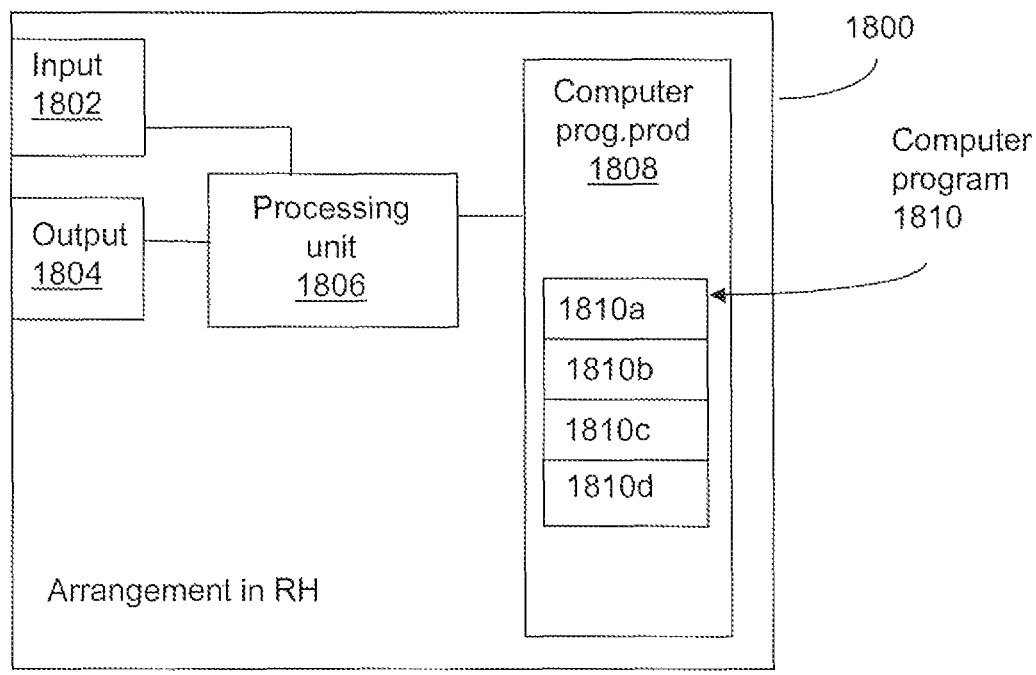
FIG. 18 is a schematic block diagram of an exemplary embodiment of an arrangement in an RH.

FIG. 18 schematically shows an embodiment of an arrangement 1800 for use in an RH 21, which also can be an alternative way of disclosing an embodiment of the arrangement 1605 in an RH 21 illustrated in FIG. 17. Comprised in the arrangement 1800 is a processing unit 1806, e.g. with a Digital Signal Processor (DSP), micro processor etc. The processing unit 1806 may be a single unit or a plurality of units to perform different actions of procedures described herein. The arrangement 1800 may also comprise an input unit 1802 for receiving signals from other entities, and an output unit 1804 for providing signal(s) to other entities. The input unit 1802 and the output unit 1804 may be arranged as an integrated entity.

Furthermore, the arrangement 1800 comprises at least one computer program product 1808 in the form of a non-volatile or volatile memory, e.g. an Electrically Erasable Programmable Read-only Memory (EEPROM), a flash memory, a disk drive or a Random-access memory (RAM). The computer program product 1808 comprises a computer program 1810, which comprises code means, which when executed in the processing unit 1806 in the arrangement 1800 causes the arrangement 1605 and/or the RH 21 to perform the actions of any of the procedures described earlier in conjunction with FIGS. 4-5.

The computer program 1810 may be configured as a computer program code structured in computer program modules. Hence, in an exemplifying embodiment, the code means in the computer program 1810 of the arrangement 2000 comprises an amplifying module 1810a for amplifying, by an amplification unit, a signal to be transmitted from the RH to the RU. The code means further comprises a changing module 1810b for changing the signal amplification level. The code means further comprises a transmitting module 1810c for transmitting the amplified signal to the RU for subsequent compensation for the signal amplification level change at the RH such that the strength of the signal is transparent to the base station system. The code means may further comprise a second transmitting module 1810d for transmitting information of a current signal amplification level to the RU.

Figure 19:
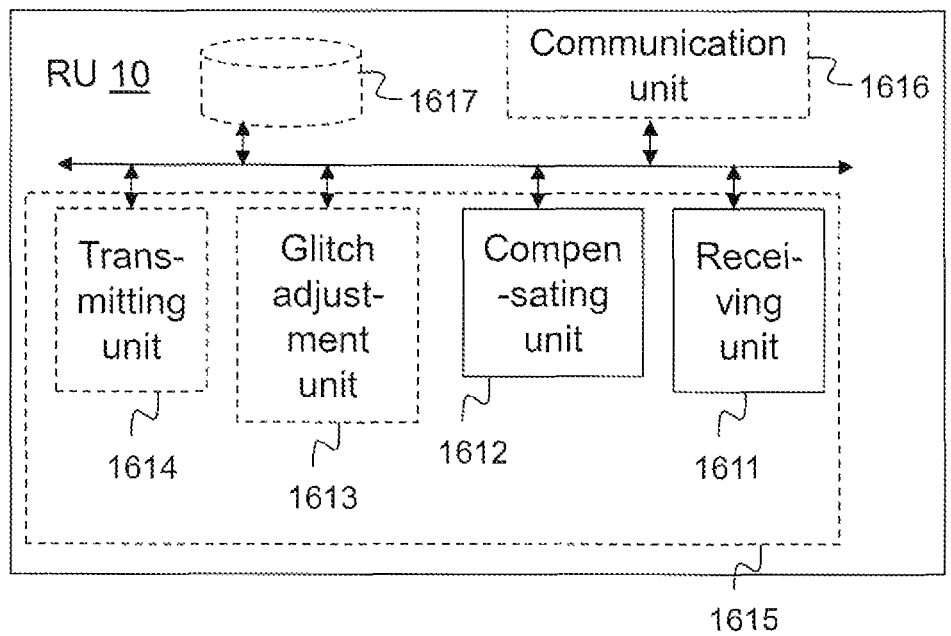
FIG. 19 is a schematic block diagram of an exemplary embodiment of an RU.

In FIG. 19 an RU 10 is shown, which is operable in a base station system of a wireless communication network and arranged for increasing signal quality of signals sent from an radio head, RH 21, to the RU over a metallic conductor. The base station system comprises a BBU, the RU and the RH. The RU is connected to the RH via the metallic conductor. The RU 10 comprises a receiving unit 1611 for receiving a signal transmitted from the RH, the signal being amplified at the RH. The RU further comprises a compensating unit 1612 capable of adapting its amplification level for compensating for the signal amplification performed at the RH such that the strength of the signal is transparent to the base station system. The RU 10 may further comprise a communication unit 1616, which may be considered to comprise conventional means for communication from and/or to the RH and from and/or to the BBU. The network node 110 may further comprise one or more storage units or memories 1617.

According to an embodiment, the receiving unit 1611 may further be arranged for receiving information of a current amplification level at the RH from the RH. The compensating unit 1612 may further be arranged for compensating according to the received information.

According to an embodiment, the receiving unit 1611 may be arranged for receiving of information of a current amplification level by, at a first point of time, receiving information from the RH of a current amplification level at the RH, and at a second point of time later than the first point of time, receiving information from the RH of a current amplification level at the RH. The compensating unit 1612 may be arranged for comparing the amplification level at the second point of time with the amplification level at the first point of time to detect a difference in amplification level, and for compensating according to the detected difference in amplification level.

According to another embodiment, the receiving unit 1611 is arranged for receiving the information of the current amplification level over a carrier frequency outside a frequency band used for the reception of the signal.

According to another embodiment, the RU may further comprise a glitch adjustment unit 1613 arranged after the compensating unit 1612 in a propagation direction of the received signal, for detecting sudden changes in signal strength, and for adjusting the detected changes such that the strength of the signal is reduced at the detected changes. The glitch adjustment unit may be a fast AGC, which may also be used to protect the ADC from saturation.

According to another embodiment, the compensating unit 1612 is arranged for compensating for a signal amplification adjustment performed at the RH only if under normal operating conditions, and, if under a special operating condition differing from the normal operating conditions, the compensating unit is arranged for only partially compensating for the signal amplification adjustment performed at the RH. The compensating unit may be a variable gain amplifier or any other similar unit (e.g. a variable attenuator) that can adapt its gain amplification such that if the signal amplification at the RH is increased with an amount, the signal amplification at the compensating unit is decreased with the same amount. For this reason the variable gain amplifier or any other similar unit may also be arranged with an information receiving input for receiving information of the current amplification level at the RH and adapt its gain amplification according to the received information.

The RU 10 may further comprise a transmitting unit 1614 for transmitting the compensated signal to the BBU. The receiving unit 1611, the compensating unit 1612, the glitch adjustment unit 1613 and the transmitting unit 1614 may be arranged in an arrangement 1615. The arrangement 1615 could be implemented e.g. by one or more of: a processor or a micro processor and adequate software and storage therefore, a Programmable Logic Device, PLD, or other electronic component(s)/processing circuit(s) configured to perform the actions, or methods, mentioned above.

Figure 20:
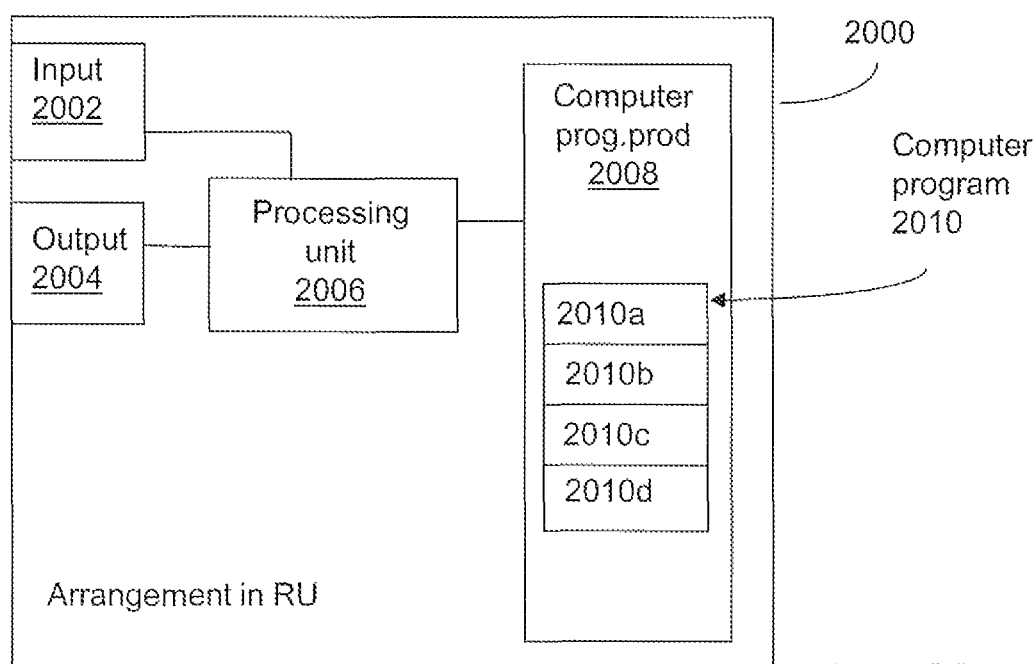
FIG. 20 is a schematic block diagram of an exemplary embodiment of an arrangement in an RU.

FIG. 20 schematically shows an embodiment of an arrangement 2000 for use in an RU 10, which also can be an alternative way of disclosing an embodiment of the arrangement 1615 in an RU 10 illustrated in FIG. 19. Comprised in the arrangement 2000 is a processing unit 2006, e.g. with a Digital Signal Processor (DSP). The processing unit 2006 may be a single unit or a plurality of units to perform different actions of procedures described herein. The arrangement 2000 may also comprise an input unit 2002 for receiving signals from other entities, and an output unit 2004 for providing signal(s) to other entities. The input unit 2002 and the output unit 2004 may be arranged as an integrated entity.

Furthermore, the arrangement 2000 comprises at least one computer program product 2008 in the form of a non-volatile or volatile memory, e.g. an Electrically Erasable Programmable Read-only Memory (EEPROM), a flash memory, a disk drive or a Random-access memory (RAM). The computer program product 2008 comprises a computer program 2010, which comprises code means, which when executed in the processing unit 2006 in the arrangement 2000 causes the arrangement 1615 and/or the RU 10 to perform the actions of any of the procedures described earlier in conjunction with FIGS. 6-7.

The computer program 2010 may be configured as a computer program code structured in computer program modules. Hence, in an exemplifying embodiment, the code means in the computer program 2010 of the arrangement 2000 comprises a receiving module 2010a for receiving a signal transmitted from the RH, the signal being amplified by an amplification unit at the RH. The code means further comprises a compensating module 2010b for compensating, by a compensating unit capable of adapting its amplification level, at the RU, for a signal amplification change performed at the RH such that the strength of the signal is transparent to the base station system. The code means may further comprise a second receiving module 2010c for receiving information of a current signal amplification level to the RU, and a control module 2010d for controlling the compensating of the compensating module according to the received information.

The acts which have above been described as being implemented or executed by a processor may be performed by any suitable machine. The machine may take the form of electronic circuitry in the form of a computer implementation platform or a hardware circuit platform. A computer implementation of the machine platform may be realized by or implemented as one or more computer processors or controllers as those terms are herein expansively defined, and which may execute instructions stored on non-transient computer-readable storage media. In such a computer implementation the machine platform may comprise, in addition to a processor(s), a memory section, which in turn can comprise random access memory; read only memory; an application memory, a non-transitory computer readable medium which stores, e.g., coded non instructions which can be executed by the processor to perform acts described herein; and any other memory such as cache memory, for example. Another example platform suitable is that of a hardware circuit, e.g., an application specific integrated circuit, ASIC, wherein circuit elements are structured and operated to perform the various acts described herein.

The invention according to any of the described embodiments has one or more of the following advantages: Reducing system noise figure significantly; Increase copper cable reach; Mitigate blocking scenario; Increase radio coverage; Increase UE battery time.

A radio head is equivalent to an active antenna element, a radio unit is equivalent to a radio resource unit and a baseband unit is equivalent to a digital unit.

The metallic conductor between the RH and the RU may in some cases be replaced by a microwave link, a milliwave link, or similar type of link, and at least some of the methods may be useable also in such a system.

Although the description above contains a plurality of specificities, these should not be construed as limiting the scope of the concept described herein but as merely providing illustrations of some exemplifying embodiments of the described concept. It will be appreciated that the scope of the presently described concept fully encompasses other embodiments which may become obvious to those skilled in the art, and that the scope of the presently described concept is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for an apparatus or method to address each and every problem sought to be solved by the presently described concept, for it to be encompassed hereby.

The invention claimed is:

1. A Method performed by a base station system of a wireless communication network, for increasing signal quality of signals sent from a radio head (RH) to a radio unit (RU) over a metallic conductor, the base station system comprising a baseband unit (BBU), the RU, and the RH, wherein the RU is connected to the RH via the metallic conductor, the method comprising, at the RH:
   amplifying, by an amplification unit, a signal to be transmitted from the RH to the RU;
   changing a signal amplification level of the amplification unit; and
   transmitting the amplified signal to the RU, the method further comprising, at the RU:
   receiving the amplified signal; and
   compensating, by a compensating unit capable of adapting its amplification level, for the change in signal amplification level performed at the RH such that the strength of the signal is transparent to the base station system.

2. The method according to claim 1, further comprising, at the RH, transmitting information of a current signal amplification level at the RH to the RU, and, at the RU, receiving information of the current amplification level at the RH, and wherein the compensating is performed according to the received information.

3. A method performed by a radio head (RH) operable in a base station system of a wireless communication network, for increasing signal quality of signals transmitted from the RH to a radio unit (RU) over a metallic conductor, wherein the base station system comprises a baseband unit (BBU), the RU, and the RH, the RH being connected to the RU via the metallic conductor, the method comprising:
  amplifying, by an amplification unit, a signal to be transmitted from the RH to the RU;
  changing a signal amplification level; and
  transmitting the amplified signal to the RU for subsequent compensation for the signal amplification level change at the RH such that the strength of the signal is transparent to the base station system.

4. The method according to claim 3, wherein the signal to be transmitted is amplified to a signal strength level approximately equal to a maximum allowed signal strength level of the metallic conductor, or is amplified by a maximum possible gain of the amplifier, when the signal strength level to which the signal is amplified with maximum possible gain is below the maximum allowed signal strength level of the metallic conductor.

5. The method according to claim 3, further comprising:
  transmitting information of a current signal amplification level to the RU.

6. The method according to claim 5, wherein the information of the current signal amplification level is transmitted over a carrier frequency outside a frequency band used for the transmission of the amplified signal.

7. The method according to claim 5, further comprising:
  delaying the transmission of the signal in relation to the transmission of the information of the current signal amplification level such that the signal is received at the RU at substantially the same time as a compensation is started to be performed at the RH according to the transmitted information of the current signal amplification level.

8. A method performed by a radio unit (RU) operable in a base station system of a wireless communication network, for increasing signal quality of signals sent from a radio head (RH) to the RU over a metallic conductor, wherein the base station system comprises a baseband unit (BBU), the RU, and the RH, wherein the RU is connected to the RH via the metallic conductor, the method comprising:
  receiving a signal transmitted from the RH, the signal being amplified by an amplification unit at the RH; and
  compensating, by a compensating unit capable of adapting its amplification level, at the RU, for a signal amplification change performed at the RH such that the strength of the signal is transparent to the base station system.

9. The method according to claim 8, further comprising:
  receiving information of a current amplification level at the RU from the RH; and
  controlling the compensating according to the received information.

10. The method according to claim 9, wherein the receiving of information comprises, at a first point of time, receiving information from the RH of a current amplification level at the RH and at a second point of time later than the first point of time, receiving information from the RH of a current amplification level at the RH, and comparing the amplification level at the second point of time with the amplification level at the first point of time to detect a difference in amplification level, and wherein the compensating is controlled according to the detected difference in amplification level.

11. The method according to claim 9, wherein the information of the current amplification level is received over a carrier frequency outside a frequency band used for the reception of the signal.

12. The method according to claim 8, further comprising, after the compensating has been performed, detecting sudden changes in signal strength, and adjusting the detected changes such that the signal strength is reduced at the detected changes.

13. The method according to claim 8, wherein the compensating for the signal amplification change performed at the RH is only performed if under normal operating conditions, and, if under a special operating condition differing from the normal operating conditions, the compensating for the signal amplification change performed at the RH is only partially performed.

14. A base station system of a wireless communication network, the base station system comprising a baseband unit (BBU), a radio unit (RU), and a radio head (RH), the RU being connected to the RH via a metallic conductor, the BBU being connected to the RU, the base station system being arranged for increasing signal quality of signals sent from the RH to the RU over the metallic conductor, wherein the RH comprises:
  an amplifying unit for amplifying a signal to be transmitted from the RH to the RU and for changing its amplification level; and
  a transmitting unit for transmitting the amplified signal to the RU, and the RU comprises:
  a receiving unit for receiving the amplified signal; and
  a compensating unit capable of adapting its amplification level, for compensating for the change in signal amplification level performed at the RH such that the strength of the signal is transparent to the base station system.

15. The base station system according to claim 14, wherein the transmitting unit is arranged for transmitting information of a current signal amplification level at the RH to the RU, and the receiving unit is arranged for receiving information of the current signal amplification level at the RH, and the compensating unit is arranged for compensating for the change in signal amplification level performed at the RH according to the received information.

16. The base station system according to claim 14, comprising a plurality of the RHs and a plurality of the RUs, and further comprising a combiner for combining an output signal from each of the compensating units of the plurality of RUs, and an automatic gain control (AGC) unit connected to the combiner for receiving the combined output signals.

17. A radio head (RH), operable in a base station system of a wireless communication network, for increasing signal quality of signals transmitted from the RH to a radio unit (RU) over a metallic conductor, wherein the base station system comprises a baseband unit (BBU), the RU, and the RH, the RH being connected to the RU via the metallic conductor, the RH comprising:
  an amplifying unit for amplifying a signal to be transmitted from the RH to the RU and for changing a signal amplification level; and
  a transmitting unit (1604) for transmitting the amplified signal to the RU for subsequent compensation for the signal amplification level change at the RH such that the strength of the signal is transparent to the base station system.

18. The radio head according to claim 17, wherein the amplifying unit is arranged to amplify the signal to be transmitted to a signal strength level approximately equal to a maximum allowed signal strength level of the metallic conductor, or to amplify the signal to be transmitted by a maximum possible gain of the amplifier, when the signal strength level to which the signal is amplified with maximum possible gain is below the maximum allowed signal strength level of the metallic conductor.

19. The radio head according to claim 17, wherein the transmitting unit is further arranged for transmitting information of a current signal amplification level to the RU.

20. The radio head according to claim 19, wherein the transmitting unit is further arranged for transmitting the information of the current signal amplification level over a carrier frequency outside a frequency band used for the transmission of the amplified signal.

21. The radio head according to claim 19, further comprising:
a delay circuit for delaying the transmission of the signal in relation to the transmission of the information of the current signal amplification level such that the signal is received at the RU at substantially the same time as a compensation is started to be performed at the RH according to the transmitted information of the current signal amplification level.

22. A radio unit (RU) operable in a base station system of a wireless communication network, arranged for increasing signal quality of signals sent from a radio head (RH) to the RU over a metallic conductor, wherein the base station system comprises a baseband unit (BBU), the RU, and the RH, wherein the RU is connected to the RH via the metallic conductor, the RU comprising:
a receiving unit for receiving a signal transmitted from the RH, the signal being amplified at the RH; and
a compensating unit capable of adapting its amplification level for compensating for the signal amplification performed at the RH such that the strength of the signal is transparent to the base station system.

23. The radio unit according to claim 22, wherein the receiving unit is further arranged for receiving information of a current amplification level at the RH from the RH, and the compensating unit is arranged for compensating according to the received information.

24. The radio unit according to claim 22, wherein the receiving unit is arranged for receiving of information of a current amplification level by, at a first point of time, receiving information from the RH of a current amplification level at the RH, and at a second point of time later than the first point of time, receiving information from the RH of a current amplification level at the RH, and the compensating unit is arranged for comparing the amplification level at the second point of time with the amplification level at the first point of time to detect a difference in amplification level, and for compensating according to the detected difference in amplification level.

25. The radio unit according to claim 23, wherein the receiving unit is arranged for receiving the information of the current amplification level over a carrier frequency outside a frequency band used for the reception of the signal.

26. The radio unit according to claim 22, further comprising a glitch adjustment unit arranged after the compensating unit in a propagation direction of the signal, for detecting sudden changes in signal strength, and for adjusting the detected changes such that the strength of the signal is reduced at the detected changes.

27. The radio unit according to claim 22, wherein the compensating unit is arranged for compensating for a signal amplification adjustment performed at the RH only if under normal operating conditions, and, if under a special operating condition differing from the normal operating conditions, the compensating unit is arranged for only partially compensating for the signal amplification adjustment performed at the RH.

28. A non-transient computer-readable storage medium that stores instructions, which when run in a radio head (RH) operable in a base station system of a wireless communication network, wherein the base station system comprises a baseband unit (BBU), a radio unit (RU), and the RH, the RH being connected to the RU via a metallic conductor, the instructions causing the RH to perform the following operations:
amplifying, by an amplification unit, a signal to be transmitted from the RH to the RU;
changing a signal amplification level; and
transmitting the amplified signal to the RU for subsequent compensation for the signal amplification level change at the RH such that the strength of the signal is transparent to the base station system.

29. The non-transient computer-readable storage medium according to claim 28, the instructions further causing, at the RH, transmitting information of a current signal amplification level at the RH to the RU, and, at the RU, receiving information of the current amplification level at the RH, and wherein the compensating is performed according to the received information.

30. A non-transient computer-readable storage medium that stores instructions, which when run in a radio unit (RU) operable in a base station system of a wireless communication network, wherein the base station system comprises a baseband unit (BBU), the RU, and a radio head (RH), the RH being connected to the RU via a metallic conductor, the instructions causing the RH to perform the following steps:
receiving a signal transmitted from the RH, the signal being amplified by an amplification unit at the RH; and
compensating, by a compensating unit capable of adapting its amplification level, at the RU, for a signal amplification change performed at the RH such that the strength of the signal is transparent to the base station system.

31. The non-transient computer-readable storage medium according to claim 30, the instructions further causing:
receiving information of a current amplification level at the RU from the RH; and
controlling the compensating according to the received information.

* * * * *

UNITED STATES PATENT AND TRADEMARK OFFICE
CERTIFICATE OF CORRECTION

| | |
|---|---|
| PATENT NO. | : 9,661,686 B2 |
| APPLICATION NO. | : 14/232883 |
| DATED | : May 23, 2017 |
| INVENTOR(S) | : Berg et al. |

It is certified that error appears in the above-identified patent and that said Letters Patent is hereby corrected as shown below:

On the Title Page

In Item (56), under "FOREIGN PATENT DOCUMENTS", in Column 2, Line 2, delete "KP" and insert -- KR --, therefor.

In the Specification

In Column 1, below Title, insert -- CROSS-REFERENCE TO RELATED APPLICATIONS
This application is a National stage of International Application No. PCT/EP2013/072490, filed October 28, 2013, which claims priority to US Application No. 61/882,390, filed September 25, 2013, which are hereby incorporated by reference. --.

In Column 1, Line 40, delete "RoCU," and insert -- RoCu, --, therefor.

In Column 1, Line 50, delete "RoCU," and insert -- RoCu, --, therefor.

In Column 1, Line 51, delete "RoCU" and insert -- RoCu --, therefor.

In Column 1, Line 53, delete "RoCU" and insert -- RoCu --, therefor.

In Column 1, Line 67, delete "(116)," and insert -- 116, --, therefor.

In Column 3, Line 11, delete "RoCU" and insert -- RoCu --, therefor.

In Column 3, Line 23, delete "RoCU" and insert -- RoCu --, therefor.

In Column 3, Line 27, delete "RoCU" and insert -- RoCu --, therefor.

Signed and Sealed this
Fifth Day of September, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,661,686 B2

In Column 3, Line 53, delete "RoCU" and insert -- RoCu --, therefor.

In Column 4, Line 12, delete "RoCU" and insert -- RoCu --, therefor.

In Column 4, Line 57, delete "RoCU" and insert -- RoCu --, therefor.

In Column 5, Line 61, delete "RoCU" and insert -- RoCu --, therefor.

In Column 9, Line 28, delete "Ga" and insert -- $G_a$ --, therefor.

In Column 9, Line 28, delete "Fa." and insert -- $F_a$. --, therefor.

In Column 9, Line 29, delete "Lc." and insert -- $L_c$. --, therefor.

In Column 9, Line 31, delete "Nc," and insert -- $N_c$, --, therefor.

In Column 9, Line 35, delete "Gb" and insert -- $G_b$ --, therefor.

In Column 9, Line 35, delete "Fb." and insert -- $F_b$. --, therefor.

In Column 9, Line 36, delete "digital," and insert -- digital converter, --, therefor.

In Column 10, Line 6, delete "Pc." and insert -- $P_c$. --, therefor.

In Column 10, Line 11, delete "Ga" and insert -- $G_a$ --, therefor.

In Column 10, Line 14, delete "Pc" and insert -- $P_c$ --, therefor.

In Column 10, Line 15, delete "Pr,max" and insert -- $P_{r,max}$ --, therefor.

In Column 10, Line 16, delete "Pr,max" and insert -- $P_{r,max}$ --, therefor.

In Column 10, Line 16, delete "Ga" and insert -- $G_a$ --, therefor.

In Column 10, Line 27, delete "Pr(t)" and insert -- $P_r(t)$ --, therefor.

In Column 12, Line 66, delete "Fi" and insert -- $F_i$ --, therefor.

In Column 12, Line 66, delete "Gi" and insert -- $G_i$ --, therefor.

In Column 13, Line 1, delete "(Ga and Gb)," and insert -- ($G_a$ and $G_b$), --, therefor.

In Column 13, Line 1, delete "(Lc)." and insert -- ($L_c$). --, therefor.
In Column 14, Line 19, delete "FIG. 16" and insert -- FIG. 14 --, therefor.

In Column 14, Line 20, delete "FIG. 16." and insert -- FIG. 14. --, therefor.

In Column 14, Line 27, delete "FIG. 17" and insert -- FIG. 17, --, therefor.

In Column 14, Line 45, delete "RH 21 110" and insert -- RH 21 --, therefor.

In Column 14, Line 49, delete "network node 110" and insert -- RH 21 --, therefor.

In Column 16, Line 5, delete "FIG. 19" and insert -- FIG. 19, --, therefor.

In Column 16, Lines 7-8, delete "an radio" and insert -- a radio --, therefor.

In Column 16, Line 20, delete "network node 110" and insert -- RU 10 --, therefor.

In the Claims

In Column 18, Line 38, in Claim 1, delete "Method" and insert -- method --, therefor.

In Column 18, Line 49, in Claim 1, delete "the method" and insert the same at Line 50 before "further" as a new sub-point.

In Column 20, Line 56, in Claim 17, delete "unit (1604)" and insert -- unit --, therefor.